US010050448B2
::::

(12) United States Patent
Kolla et al.

(10) Patent No.: US 10,050,448 B2
(45) Date of Patent: Aug. 14, 2018

(54) PROVIDING CURRENT CROSS-CONDUCTION PROTECTION IN A POWER RAIL CONTROL SYSTEM

(71) Applicant: QUALCOMM Incorporated, San Diego, CA (US)

(72) Inventors: Yeshwant Nagaraj Kolla, Wake Forest, NC (US); Neel Shashank Natekar, Raleigh, NC (US); Manish Garg, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 268 days.

(21) Appl. No.: 15/130,549

(22) Filed: Apr. 15, 2016

(65) Prior Publication Data

US 2016/0308372 A1    Oct. 20, 2016

Related U.S. Application Data

(63) Continuation-in-part of application No. 15/087,377, filed on Mar. 31, 2016.
(Continued)

(51) Int. Cl.
*H02J 4/00* (2006.01)
*G06F 1/26* (2006.01)
(Continued)

(52) U.S. Cl.
CPC .............. *H02J 4/00* (2013.01); *G06F 1/263* (2013.01); *G06F 1/3296* (2013.01); *G11C 5/14* (2013.01); *Y02D 10/171* (2018.01)

(58) Field of Classification Search
CPC ........................................................ H02J 4/00
See application file for complete search history.

(56) References Cited

U.S. PATENT DOCUMENTS 7,498,836 B1    3/2009   Tuan
7,589,584 B1    9/2009   Bui
(Continued)

FOREIGN PATENT DOCUMENTS

KR        20010005090 A      1/2001

OTHER PUBLICATIONS

International Preliminary Report on Patentability for PCT/US2016/027890, dated Oct. 26, 2017, 8 pages.
(Continued)

*Primary Examiner* — Hai L Nguyen
(74) *Attorney, Agent, or Firm* — W&T/Qualcomm

(57) ABSTRACT

Power rail control systems that include power multiplexing circuits that include cross-current conduction protection are disclosed. Power multiplexing circuit includes supply selection circuits each coupled between a respective supply power rail and an output power rail coupled to a powered circuit. To maintain power to the powered circuit during switching coupling of the output power rail, but while also avoiding current cross-conduction path between supply power rails, diode drop control circuits are provided in supply selection circuits. In diode drop operation mode, the diode drop control circuit associated with a higher voltage supply power rail is configured to regulate voltage supplied by such supply power rail to the output power rail to power the powered circuit. A current cross-conduction path is not created, because diode drop control circuits associated with lower voltage supply power rails are reverse biased to prevent current from flowing through their associated supply selection circuits.

59 Claims, 12 Drawing Sheets

Related U.S. Application Data

(60) Provisional application No. 62/147,862, filed on Apr. 15, 2015.

(51) Int. Cl.
  *G11C 5/14* (2006.01)
  *G06F 1/32* (2006.01)

(56) References Cited

U.S. PATENT DOCUMENTS

| | | | |
|---|---|---|---|
| 7,737,720 B2 | 6/2010 | Idgunji et al. | |
| 7,786,870 B2 | 8/2010 | Zettler | |
| 8,138,795 B2 | 3/2012 | Hseih et al. | |
| 8,139,436 B2 | 3/2012 | Chen et al. | |
| 8,595,671 B2 | 11/2013 | He | |
| 8,605,534 B2 | 12/2013 | Lee et al. | |
| 8,635,572 B1 | 1/2014 | Jin et al. | |
| 9,001,572 B2 | 4/2015 | Choi et al. | |
| 9,059,696 B1 | 6/2015 | Rahman | |
| 9,225,175 B2 * | 12/2015 | Kim | H01L 27/088 |
| 9,337,660 B1 * | 5/2016 | Bourstein | H02J 4/00 |
| 9,785,181 B2 * | 10/2017 | Ichino | G05F 5/00 |
| 9,825,468 B1 * | 11/2017 | Bryson | H02J 4/00 |
| 2001/0052758 A1 | 12/2001 | Odaohhara | |
| 2002/0158683 A1 | 10/2002 | Berthold | |
| 2007/0210750 A1 | 9/2007 | Cha | |
| 2008/0043560 A1 | 2/2008 | Ko et al. | |
| 2008/0284407 A1 | 11/2008 | Miermont et al. | |
| 2010/0254209 A1 | 10/2010 | Lee et al. | |
| 2012/0117391 A1 | 5/2012 | Jacquet et al. | |
| 2014/0097702 A1 | 4/2014 | Upputuri et al. | |
| 2014/0167813 A1 | 6/2014 | Raychowdhury et al. | |
| 2015/0067290 A1 | 3/2015 | Chaba et al. | |
| 2015/0082065 A1 | 3/2015 | Bose et al. | |
| 2016/0306412 A1 | 10/2016 | Kolla et al. | |
| 2017/0346299 A1 | 11/2017 | Sridhar et al. | |

OTHER PUBLICATIONS

International Search Report and Written Opinion for PCT/US2016/027890, dated Jun. 30, 2016, 11 pages.

Bhardwaj, Nitin, "Decoupling Capacitance," Electrical & Computer Engineering, University of Rochester, NY, Date Unknown, 4 pages.

Cheng, Wayne H. et al., "Dynamic Voltage and Frequency Scaling Circuits with Two Supply Voltages," IEEE International Symposium on Circuits and Systems, ISCAS 2008, May 18, 2008, pp. 1236-1239.

Second Written Opinion for PCT/US2017/032632, dated May 3, 2018, 9 pages.

* cited by examiner

| FIRST POWER RAIL SELECTION SIGNAL (216(1)) | SECOND POWER RAIL SELECTION SIGNAL (216(2)) | SUPPLY POWER RAIL SWITCH SIGNAL (222) | OUTPUT POWER RAIL (206) |
|---|---|---|---|
| 0 | 1 | 1 | @ $V_{DD2}$ |
| 0 | 1 | 0 | @ higher of $V_{DD2}$ or $V_{DD1}$ in diode drop mode |
| 1 | 0 | 0 | @ higher of $V_{DD2}$ or $V_{DD1}$ in diode drop mode |
| 1 | 0 | 1 | @ $V_{DD1}$ |

| | FIRST POWER RAIL SELECTION SIGNAL (216(1)) | SECOND POWER RAIL SELECTION SIGNAL (216(2)) | SUPPLY POWER RAIL SWITCH SIGNAL (222) | OUTPUT POWER RAIL (206) |
|---|---|---|---|---|
| 804(1) | 1 | 0 | 0 | @ $V_{DD1}$ |
| 804(2) | 1 | 0 | 1 | @ $V_{DD1}$ |
| 804(3) | 0 | 0 | 1 | @ higher of $V_{DD1}$ or $V_{DD2}$ in diode drop mode |
| 804(4) | 0 | 1 | 1 | @ $V_{DD2}$ |
| 804(5) | 0 | 1 | 0 | @ $V_{DD2}$ |

*FIG. 8A*

PROVIDING CURRENT CROSS-CONDUCTION PROTECTION IN A POWER RAIL CONTROL SYSTEM

PRIORITY APPLICATION

The present application claims priority under 35 U.S.C. §119(e) to U.S. Provisional Patent Application Ser. No. 62/147,862, filed on Apr. 15, 2015, and entitled "SELECTIVE COUPLING OF POWER RAIL(S) TO MEMORY DOMAIN(S) IN A MICROPROCESSOR-BASED SYSTEM TO REDUCE INTENTIONAL DECOUPLING CAPACITANCE IN LOGIC DOMAIN(S)," which is incorporated herein by reference in its entirety.

The present application is also a continuation-in-part application of U.S. application Ser. No. 15/087,377, filed on Mar. 31, 2016, and entitled "SELECTIVE COUPLING OF POWER RAILS TO A MEMORY DOMAINS IN A PROCESSOR-BASED SYSTEM," which is incorporated herein by reference in its entirety.

BACKGROUND

I. Field of the Disclosure

The technology of the disclosure relates generally to power multiplexing circuits configured to selectively supply power from multiple power rails to powered circuits.

II. Background

Circuits are increasingly being designed with power conservation in mind. This is particularly the case for portable electronic devices that are battery-powered. Common examples include mobile phones and laptop computers, among others. Increased power consumption undesirably results in faster battery drainage and shorter battery life. One method of conserving power is to lower an operating frequency of the circuit according to the active power equation $P=CV^2f$. However, reducing the operating frequency results in lower circuit performance (i.e., speed). Another method of conserving power is to lower the operating voltage, since generally, active power reduces quadratically for a given reduction in operating voltage. However, lowering the operating voltage in a circuit lowers speed performance, which may also be undesirable. Further, certain cells or components of a circuit may have a minimum operating voltage below which they will not operate to read and write data, as well as retain data.

To address the tradeoff between performance and power consumption, multiple operating voltage domains ("voltage domains") are increasingly being provided in circuits. Circuit paths are provided which pass through the multiple voltage domains to provide different operating voltages to different components of a circuit. Providing multiple voltage domains allows a lower voltage domain to provide power to components that do not require minimum voltage levels to conserve power. Components that either have a minimum operating voltage for memory operation functionality or provide critical paths where performance cannot be sacrificed may be powered by the higher voltage domain. Providing multiple voltage domains also allows the lower voltage domain to be scaled-down to conserve power during a power conservation mode, or scaled-up to provide for increased performance (i.e., hyper-performance), without affecting the operation of the components in the higher voltage domain.

In this regard, a power multiplexing system can be employed to selectively couple a power rail among multiple power rails each having different voltage domains (voltage levels) to supply power to a circuit. FIG. 1 is a block diagram of such an exemplary power multiplexing system 100. In the example power multiplexing system 100 in FIG. 1, a first power rail 102(1) and a second power rail 102(2) are provided. The first power rail 102(1) is coupled to first voltage source 104(1) at a first voltage $V_{DD1}$. The second power rail 102(2) is coupled to a second voltage source 104(2) at a second voltage $V_{DD2}$. The first and second voltage sources 104(1), 104(2) may be provided by the same or different power supplies (not shown). For example, the first voltage $V_{DD1}$ may be 1.0 Volts (V) and the second voltage $V_{DD2}$ may be 0.6 V. As an example, the power multiplexing system 100 may be configured to selectively couple the first power rail 102(1) or the second power rail 102(2) to an output power rail 105 coupled to a powered circuit 106 based on an operational mode of the powered circuit 106. For example, if the powered circuit 106 is a memory circuit, such as a memory array in a processor-based system, the power multiplexing system 100 may be configured to couple the first power rail 102(1) during active memory operations and couple the second power rail 102(2) to the output power rail 105 during an idle mode. For example, the voltage $V_{DD2}$ may be sufficient for memory retention in the powered circuit 106.

With continuing reference to FIG. 1, the power multiplexing system 100 includes a first head switch 108(1) in the form of a P-type metal oxide semiconductor (PMOS) transistor 110(1). The PMOS transistor 110(1) is coupled between the first power rail 102(1) and the output power rail 105. The PMOS transistor 110(1) is configured to be activated and deactivated in response to a state of a first power rail enable signal 112(1) to couple and decouple, respectively the first power rail 102(1) to the output power rail 105. For example, if the first power rail enable signal 112(1) is a voltage of a logic '0' vale, the PMOS transistor 110(1) is activated to couple the first power rail 102(1) to the output power rail 102(2). However, if the first power rail enable signal 112(1) is a voltage of a logic '1' value, the PMOS transistor 110(1) is deactivated to decouple the first power rail 102(1) from the output power rail 102(2). The power multiplexing system 100 also includes second head switch 108(2), also in the form of a PMOS transistor 110(2), that is coupled between the second power rail 102(2) and the output power rail 105 to selectively couple and decouple the second power rail 102(2) to and from the output power rail 105 in response to a second power rail enable signal 112(2).

One problem with the power multiplexing system 100 in FIG. 1 is cross-conduction currents Icc flowing between the first power rail 102(1) at a higher voltage $V_{DD1}$ to the second power rail 102(2) at a lower voltage $V_{DD2}$. Cross-conduction currents Icc flow from the first power rail 102(1) to the second power rail 102(2) in this example when switching the coupling of the output power rail 105 from the first power rail 102(1) to the second power rail 102(2), and vice versa. Cross-conduction currents Icc cause various in-rush/out-rush currents due to limited impedances of the head switches 108(1), 108(2) causing issues such as device stress and power supply noise resulting in logic failures. Cross-conduction currents Icc also result in additional, wasted power consumption. Cross-conduction currents Icc can be avoided by ensuring that only one of the head switches 108(1), 108(2) is activated at a given time. For example, an active head switch 108(1), 108(2) can be turned off such that both the first and second head switches 108(1), 108(2) are turned off momentarily before turning on the other head switch 108(1), 108(2) to avoid cross-conduction currents Icc. However, if the leakage current on the output power rail 105 is too high, the voltage on the output power rail 105 may drop below a minimum retention or operating voltage of the powered circuit 106. Alternatively, the first and second head switches 108(1), 108(2) could be turned off and on with respect to each other quickly to limit the duration of the presence of the cross-conduction currents Icc. However, variance in capacitances on the first and second power rails 102(1), 102(2) and the output power rail 105 can cause charging that can drop the voltage $V_{DD1}$, $V_{DD2}$ at the first and second power rails 102(1), 102(2) and/or the output power rail 105, which may cause logic failures. The first and second power rails 102(1), 102(2) could be brought to substantially the same voltage to avoid cross-conduction currents Icc, but this results in additional power consumption.

SUMMARY OF THE DISCLOSURE

Aspects disclosed in the detailed description related to providing current cross-conduction protection in a power rail control system. In this regard, in one exemplary aspect, a power multiplexing circuit is provided in the power rail control system. The power multiplexing circuit includes a plurality of supply selection circuits. Each supply selection circuit is coupled between a respective supply power rail among a plurality of supply power rails and an output power rail which is coupled to a powered circuit. The power multiplexing circuit is configured to activate a selected supply selection circuit to couple an associated supply power rail to the output power rail to power the powered circuit at a voltage of the selected supply power rail. For example, it may be desired to couple the powered circuit to a supply power rail that has a higher voltage during a higher operation performance mode, and couple the powered circuit to another supply power rail that has a lower voltage during a lower performance mode to conserve power consumption. The other supply selection circuits associated with other supply power rails not selected to be coupled to the output power rail are deactivated such that only one supply selection circuit is activated at a time to couple one supply power rail to the output power rail to avoid creating a current cross-conduction path between the supply power rails. To avoid creating a current cross-conduction path between supply power rails, all supply selection circuits could be deactivated before any next supply selection circuit is activated to couple its associated supply power to the output power rail. However, this does not allow the powered circuit to receive power at times during the switching of the coupling of a supply power rail to the output power rail for operation.

In this regard, to maintain a voltage at the output power rail to power the powered circuit during switching of the coupling of the output power rail to a different selected supply power rail, but while also avoiding creating a current cross-conduction path between the supply power rails, a diode drop control circuit is provided in each supply selection circuit in the power multiplexing circuit. The diode drop control circuits are configured to be activated to create a diode drop connection between an associated supply power rail and the output power rail for a diode drop operation mode in response to switching of the coupling of a different supply power rail to the output power rail. In the diode drop operation mode, the diode drop control circuit associated with the supply power rail at a higher voltage is configured to regulate the voltage supplied by such supply power rail to the output power rail for providing power to the powered circuit. But, a current cross-conduction path is not created from the higher voltage supply power rail to lower voltage supply power rails, because the diode drop control circuits associated with the lower voltage supply power rails are reverse biased to prevent current from flowing through their associated supply selection circuits. In this manner, power is maintained on the output power rail to the powered circuit during the switching of the coupling of the output power rail to a different selected supply power rail, while also avoiding a current cross-conduction path between the supply power rails.

In one exemplary aspect, the supply selection circuits each include a power switching circuit in the form of a transistors that are each coupled between an associated supply power rail and the output power rail. In a diode drop operation mode in response to the switching of the coupling of the output power rail to a different selected supply power rail, the diode drop control circuit is activated to couple a gate and drain of the power switching circuit together. This causes voltage on the output power rail to not drop below a threshold voltage of the power switching circuit associated with the higher voltage supply power rail. The diode drop control circuits associated with the lower voltage supply power rails are reverse biased to prevent current from flowing through their associated power switching circuits.

In another exemplary aspect, the supply selection circuits each include a diode drop control circuit coupled between an associated supply power rail and the output power rail. In a diode drop operation mode in response to the switching of the coupling of the output power rail to a different selected supply power rail, the diode drop control circuit is activated to couple an associated supply power rail to the output power rail to regulate the voltage supplied by the associated supply power rail. This causes voltage on the output power rail to not drop below a threshold voltage of the power switching circuit associated with the higher voltage supply power rail. The diode drop control circuits associated with the lower voltage supply power rails are reverse biased to prevent current from flowing from the higher voltage supply power rail to their associated lower voltage supply power rails.

In this regard, in one exemplary aspect, a power multiplexing circuit is provided. The power multiplexing circuit comprises a first supply selection circuit. The first supply selection circuit comprises a first power switching circuit configured to receive a first supply power rail selection signal. The first power switching circuit is configured to selectively couple a first supply power rail having a first voltage to an output power rail coupled to at least one powered circuit, in response to the first supply power rail selection signal indicating a first supply power rail selection enable state. The first supply selection circuit also comprises a first diode drop control circuit. The first diode drop control circuit is configured to receive a supply power rail switch signal. The first diode drop control circuit is further configured to establish a first diode drop connection between the first supply power rail and the output power rail, in response to the supply power rail switch signal indicating a supply power rail switch enable state. The power multiplexing circuit also comprises a second supply selection circuit. The second supply selection circuit comprises a second power switching circuit. The second power switching circuit comprises a second supply power rail selection input configured to receive a second supply power rail selection signal. The second power switching circuit is configured to selectively couple a second supply power rail having a second voltage to the output power rail, in response to a second supply power rail selection signal indicating a second supply power rail selection enable state. The second supply selection circuit also comprises a second diode drop control circuit. The second diode drop control circuit is configured to receive the supply power rail switch signal. The second diode drop control circuit is also configured to establish a second diode drop connection between the second supply power rail and the output power rail, in response to the supply power rail switch signal indicating a supply power rail switch enable state.

In another exemplary aspect, a power multiplexing circuit is provided. The power multiplexing circuit comprises a means for receiving a first supply power rail selection signal. The power multiplexing circuit also comprises a means for selectively coupling a first supply power rail having a first voltage to an output power rail coupled to at least one powered circuit, in response to the first supply power rail selection signal indicating a first supply power rail selection enable state. The power multiplexing circuit also comprises a means for receiving a supply power rail switch signal. The power multiplexing circuit also comprises a means for establishing a first diode drop connection between the first supply power rail and the output power rail, in response to the supply power rail switch signal indicating a supply power rail switch enable state. The power multiplexing circuit also comprises a means for receiving a second supply power rail selection signal. The power multiplexing circuit also comprises a means for selectively coupling a second supply power rail having a second voltage to the output power rail, in response to a second supply power rail selection signal indicating a second supply power rail selection enable state. The power multiplexing circuit also comprises a means for establishing a second diode drop connection between the second supply power rail and the output power rail, in response to the supply power rail switch signal indicating a supply power rail switch enable state.

In another exemplary aspect, a method of selectively switching a coupling of a supply power rail among a plurality of supply power rails to an output power rail for powering a powered circuit is provided. The method comprises receiving a first supply power rail selection signal indicating a first supply power rail selection state. The method also comprises receiving a second supply power rail selection signal indicating a second supply power rail selection state. The method also comprises receiving a supply power rail switch signal indicating a supply power rail switch state. The method also comprises selectively coupling a first supply power rail having a first voltage to an output power rail coupled to at least one powered circuit, in response to the first supply power rail selection signal indicating a first supply power rail selection enable state. The method also comprises establishing a first diode drop connection between the first supply power rail and the output power rail, in response to the supply power rail switch signal indicating a supply power rail switch enable state. The method also comprises establishing a second diode drop connection between a second supply power rail and the output power rail, in response to the supply power rail switch signal indicating the supply power rail switch enable state. The method also comprises selectively coupling the second supply power rail having a second voltage to the output power rail, in response to the second supply power rail selection signal indicating a second supply power rail selection enable state.

In another exemplary aspect, a power rail control system for a processor-based system is provided. The power rail control system comprises a memory supply power rail configured to receive a memory voltage from a memory power supply in a memory domain. The power rail control system also comprises a logic supply power rail configured to receive a logic voltage from a logic power supply in a logic domain. The power rail control system also comprises a power multiplexing circuit. The power multiplexing circuit comprises a first supply selection circuit. The first supply selection circuit comprises a first power switching circuit configured to receive a first supply power rail selection signal. The first power switching circuit is configured to selectively couple the memory supply power rail to an array power rail coupled to at least one memory circuit in the memory domain to provide the memory voltage to the at least one memory circuit, in response to the first supply power rail selection signal indicating a first supply power rail selection enable state. The first supply selection circuit also comprises a first diode drop control circuit. The first diode drop control circuit is configured to receive a supply power rail switch signal. The first diode drop control circuit is also configured to provide a first diode drop connection between the memory supply power rail and an output power rail, in response to the supply power rail switch signal indicating a supply power rail switch enable state. The power multiplexing circuit also comprises a second supply selection circuit. The second supply selection circuit comprises a second power switching circuit. The second power switching circuit is configured to receive a second supply power rail selection signal. The second power switching circuit is configured to selectively couple the logic supply power rail to the array power rail to provide the logic voltage to the at least one memory circuit in response to a second supply power rail selection signal indicating a second supply power rail selection enable state. The second supply selection circuit also comprises a second diode drop control circuit. The second diode drop control circuit is configured to receive the supply power rail switch signal and provide a second diode drop connection between the logic supply power rail and the output power rail, in response to the supply power rail switch signal indicating the second supply power rail switch enable state.

BRIEF DESCRIPTION OF THE FIGURES

FIG. 5B is a table illustrating an exemplary sequence of the power multiplexing circuit in FIG. 4 switching the coupling of the output power rail from the second supply power rail back to the first supply power rail;

FIG. 8A is a table illustrating an exemplary sequence of the power multiplexing circuit in FIG. 7 switching the coupling of the output power rail from a first supply power rail to a second supply power rail;

DETAILED DESCRIPTION

Figure 1:
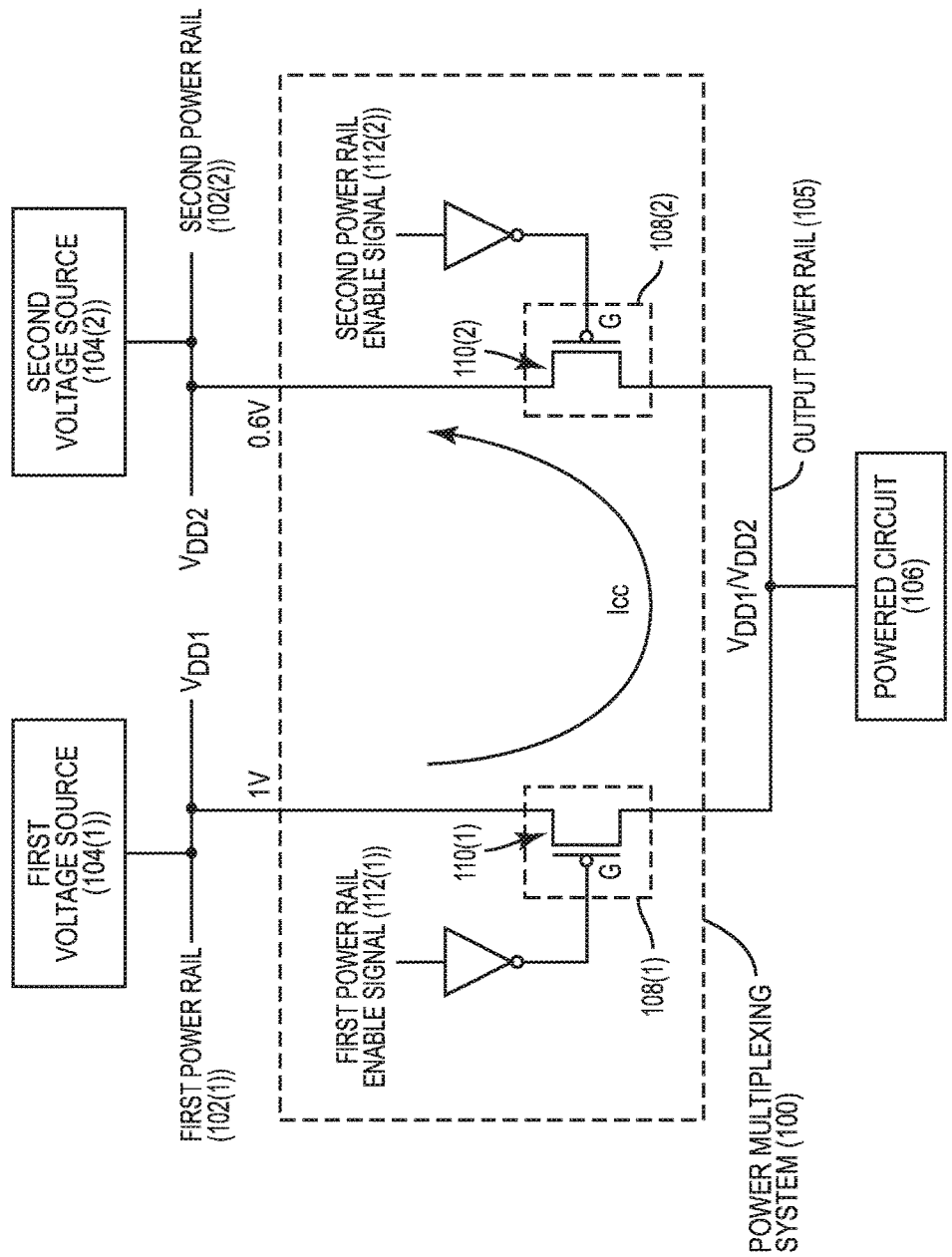
FIG. 1 is a block diagram of an exemplary power multiplexing system that is configured to selectively couple one power rail among a plurality of power rails to a powered circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
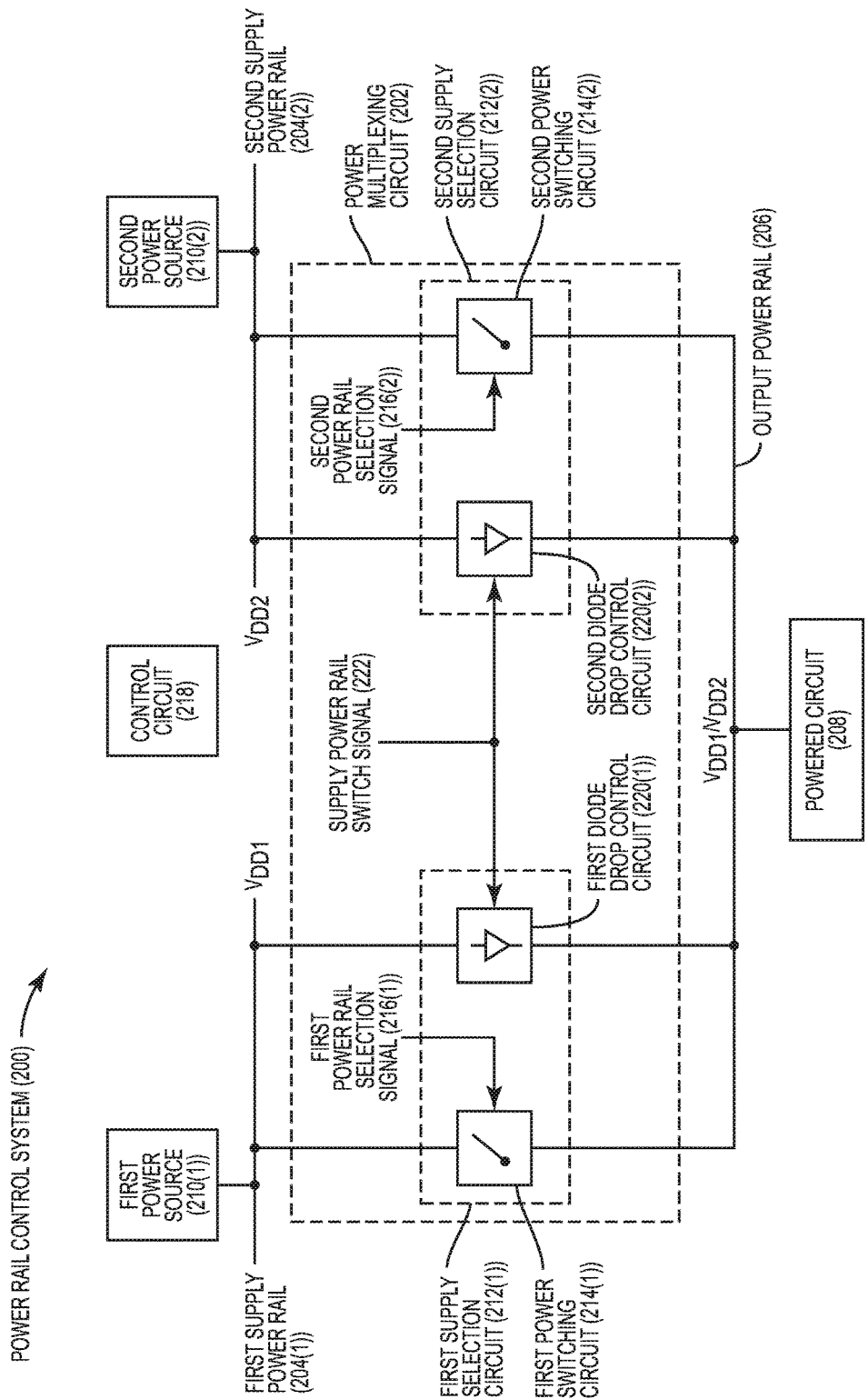
FIG. 2 is a block diagram of an exemplary power rail control system that includes an exemplary power multiplexing circuit configured to activate a selected supply selection circuit to couple an associated supply power rail to an output power rail to power a powered circuit, wherein the power multiplexing circuit additionally includes a diode drop control circuits configured to be activated to provide a diode drop connection between a supply power rail and the output power rail, in response to switch the coupling of the output power rail to a different selected supply power rail.

FIG. 2 is a block diagram of an exemplary power rail control system 200 that includes a power multiplexing circuit 202. As will be discussed in more detail below, the power multiplexing circuit 202 is configured to select one of a first supply power rail 204(1) and a second supply power rail 204(2) to be coupled to an output power rail 206 to provide power to a powered circuit 208 coupled to the output power rail 206. The first supply power rail 204(1) is coupled to a first power source 210(1). The first power source 210(1) is configured to supply a first voltage $V_{DD1}$ to the first supply power rail 204(1). A second power source 210(2) is configured to supply a second voltage $V_{DD2}$ to the second supply power rail 204(2). The power multiplexing circuit 202 is configured to couple either the first voltage $V_{DD1}$ on the first supply power rail 204(1) or the second voltage $V_{DD2}$ on the second supply power rail 204(2) to the output power rail 206 to provide either the first voltage $V_{DD1}$ or the second voltage $V_{DD2}$ to the powered circuit 208 for operation. For example, the first power source 210(1) may be configured to supply a first voltage $V_{DD}$ (e.g., 1 Volt (V)) that is a higher voltage than the second voltage $V_{DD2}$ (e.g., 0.6 V) supplied by the second power source 210(2). This supply rail configuration may be provided in the power rail control system 200, because it may be desired to couple the powered circuit 208 to a supply power rail that has a higher voltage during a higher operation performance mode, and couple the powered circuit 208 to another supply power rail that has a lower voltage during a lower performance mode to conserve power consumption.

Note that although the exemplary power multiplexing circuit 202 in FIG. 2 only shows two (2) supply power rails—the first supply power rail 204(1) and the second supply power rail 204(2), the power multiplexing circuit 202 could include additional supply power rails.

With continuing reference to FIG. 2, to selectively couple the first and second supply power rails 204(1), 204(2) to the output power rail 206 to supply either the first voltage $V_{DD1}$ or the second voltage $V_{DD2}$ to the powered circuit 208, the power multiplexing circuit 202 includes a first supply selection circuit 212(1) and a second supply selection circuit 212(2). The first supply selection circuit 212(1) is coupled between the first supply power rail 204(1) and the output power rail 206. The second supply selection circuit 212(2) is coupled between the second supply power rail 204(2) and the output power rail 206. The power multiplexing circuit 202 is configured to activate a selected first or second supply selection circuit 212(1), 212(2) to couple respective first or second supply power rails 204(1), 204(2) to the output power rail 206 to power the powered circuit 208 at the first or second voltage $V_{DD1}$, $V_{DD2}$.

To select either the first or second supply power rail 204(1), 204(2) to be coupled to the output power rail 206, the first and second supply selection circuits 212(1), 212(2) include respective first and second power switching circuits 214(1), 214(2). The first power switching circuit 214(1) is configured to receive a first supply power rail selection signal 216(1) indicating a first supply power rail selection state. The first power switching circuit 214(1) is configured to couple the first supply power rail 204(1) to the output power rail 206 in response to the first supply power rail selection signal 216(1) indicating a first supply power rail selection enable state. The first power switching circuit 214(1) is also configured to decouple the first supply power rail 204(1) from the output power rail 206 in response to the first supply power rail selection signal 216(1) indicating a first supply power rail selection disable state. For example, a control circuit 218 could be provided and configured to generate the first supply power rail selection signal 216(1) to indicate either a first supply power rail selection enable state or a first supply power rail selection disable state based on determining whether the first supply power rail 204(1) should be coupled to the output power rail 206.

Similarly, the second power switching circuit 214(2) is configured to receive a second supply power rail selection signal 216(2) indicating a second supply power rail selection state. The second power switching circuit 214(2) is configured to couple the second supply power rail 204(2) to the output power rail 206 in response to the second supply power rail selection signal 216(2) indicating a second supply power rail selection enable state. The second power switching circuit 214(2) is also configured to decouple the second supply power rail 204(2) from the output power rail 206 in response to the second supply power rail selection signal 216(2) indicating a second supply power rail selection disable state. The control circuit 218 could be configured to generate the second supply power rail selection signal 216(2) to indicate either a second supply power rail selection enable state or a second supply power rail selection disable state based on determining whether the second supply power rail 204(2) should be coupled to the output power rail 206.

For the supply power rail 204(1), 204(2) that is not selected by the control circuit 218 to be coupled to the output power rail 206, the supply selection circuit 212(1), 212(2) associated with such other supply power rail 204(1), 204(2) decouples the other supply power rail 204(1), 204(2) from the output power rail 206 in response to the first or second supply power rail selection signal 216(1), 216(2) indicating a respective first or second supply power rail selection disable state. Thus, the first and second supply selection circuits 212(1), 212(2) are controlled such that only one of the first and second supply power rail 204(1), 204(2) is coupled to the output power rail 206 at a time. This avoids creating a current cross-conduction path between the first and second supply power rails 204(1), 204(2). To avoid a current cross-conduction path between the first and second supply power rails 204(1), 204(2), both supply selection circuits 212(1), 212(2) could be controlled to decouple both the first and second supply power rails 204(1), 204(2) from the output power rail 206 before any next supply selection circuit 212(1), 212(2) is activated to couple its associated first or second supply power rail 204(1), 204(2) to the output power rail 206. However, this may not allow the powered circuit 208 to receive power at times during the switching of the coupling between the first and second supply power rails 204(1), 204(2) to the output power rail 206. The powered circuit 208 may require a minimum voltage for operation or retention of data, such as if the powered circuit 208 were a memory circuit.

In this regard, to maintain a voltage at the output power rail 206 to power the powered circuit 208 during switching of the coupling of the output power rail 206 between the first and second supply power rails 204(1), 204(2), but while also avoiding creating a current cross-conduction path between the first and second supply power rails 204(1), 204(2), the first and second supply selection circuits 212(1), 212(2) include respective diode drop control circuits 220(1), 220 (2). The diode drop control circuits 220(1), 220(2) are configured to be activated to create a diode drop connection between a respective first or second supply power rail 204(1), 204(2) and the output power rail 206 for a diode drop operation mode in response to switching of the coupling of a different supply power rail 204(1), 204(2) to the output power rail 206. In this regard, the first diode drop control circuit 220(1) is configured to receive a supply power rail switch signal 222 indicating a supply power rail switch state. In response to the supply power rail switch signal 222 indicating a supply power rail switch enable state, the first diode drop control circuit 220(1) establishes a diode drop connection between the first supply power rail 204(1) and the output power rail 206 in a diode drop operation mode. Also, the second diode drop control circuit 220(1) establishes a diode drop connection between the second supply power rail 204(2) and the output power rail 206 in a diode drop operation mode in response to the supply power rail switch signal 222 indicating a supply power rail switch enable state.

Current cross-conduction can only occur in one direction between the supply power rail 204(1) or 204(2) with the higher voltage $V_{DD1}$ or $V_{DD2}$ to the supply power rail 204(2) or 204(1) with the lower voltage $V_{DD2}$ or $V_{DD1}$. Thus, the diode drop control circuit 220(1), 220(2) associated with the supply power rail 204(1), 204(2) at a higher voltage $V_{DD1}$, $V_{DD2}$ is configured to regulate the voltage on the output power rail 206 in a forward bias configuration. For example, if the first voltage $V_{DD1}$ on the first supply power rail 204(1) is higher than the second voltage $V_{DD2}$ on the second supply power rail 204(2), the first diode drop control circuit 220(1) will be in a forward bias configuration. The first diode drop control circuit 220(1) is configured to allow current to flow from the first supply power rail 204(1) to the output power rail 206 to maintain a voltage on the output power rail 206. In one example, the first diode drop control circuit 220(1) is configured to regulate the voltage on the output power rail 206 to a threshold voltage of the first diode drop control circuit 220(1) less than the first voltage $V_{DD1}$. As the voltage on the output power rail 206 discharges to the threshold voltage of the first diode drop control circuit 220(1) less than the first voltage $V_{DD1}$, the first diode drop control circuit 220(1) will allow current to flow to maintain the voltage (e.g., 0.8 V) to a threshold voltage (e.g., 0.2 V) of the first diode drop control circuit 220(1) less than the first voltage $V_{DD1}$ (e.g., 1 V). However, the second diode drop control circuit 220(2) in this example will be in a reverse bias configuration to prevent current flow from the output power rail 206 to the second supply power rail 204(2), because the second voltage $V_{DD2}$ is lower than the first voltage $V_{DD1}$. Thus, the second diode drop control circuit 220(2) prevents a current cross-conduction path from being created from the first supply power rail 204(1) to the second supply power rail 204(2) during the switching of the coupling of the first or second supply power rail 204(1), 204(2) to the output power rail 206. In this manner, a voltage is continuously provided to the powered circuit 208 during the diode drop operation mode even when switching the coupling of the first or second supply power rail 204(1), 204(2) to the output power rail 206, but without creating a current cross-conduction path between the first supply power rail 204(1) to the second supply power rail 204(2). To reduce power consumption during diode drop operation mode, the powered circuit 208 may be configured to be in a retention or reduced power consumption state where only leakage currents are drawn from the output power rail 206 in a non-limiting example.

Note that although the example of the diode drop operation mode above is in reference to the first voltage $V_{DD1}$ on the first supply power rail 204(1) being higher than the second voltage $V_{DD2}$ on the second supply power rail 204(2), the diode drop operation mode is the same in reverse if the second voltage $V_{DD2}$ is higher than the first voltage $V_{DD2}$.

After the switching of the coupling of first or second supply power rail 204(1), 204(2) to the output power rail 206, the diode drop operation mode can be discontinued. In this regard, the supply power rail switch signal 222 is controlled to indicate a supply power rail switch disable state. In response, the first diode drop control circuit 220(1) disconnects the diode drop connection between the first supply power rail 204(1) and the output power rail 206. Also in response, the second diode drop control circuit 220(2) disconnects the diode drop connection between the second supply power rail 204(2) and the output power rail 206 in a diode drop operation mode. A current cross-conduction path is not created when the diode drop operation mode is discontinued, because only either the first supply power rail selection signal 216(1) or the second supply power rail selection signal 216(2) is controlled to be in a power rail selection enable state to select only the first power switching circuit 214(1) or the second power switching circuit 214(2) to couple either the first or second supply power rail 204(1), 204(2) to the output power rail 206 at any given time outside of the diode drop operation mode.

Figure 3:
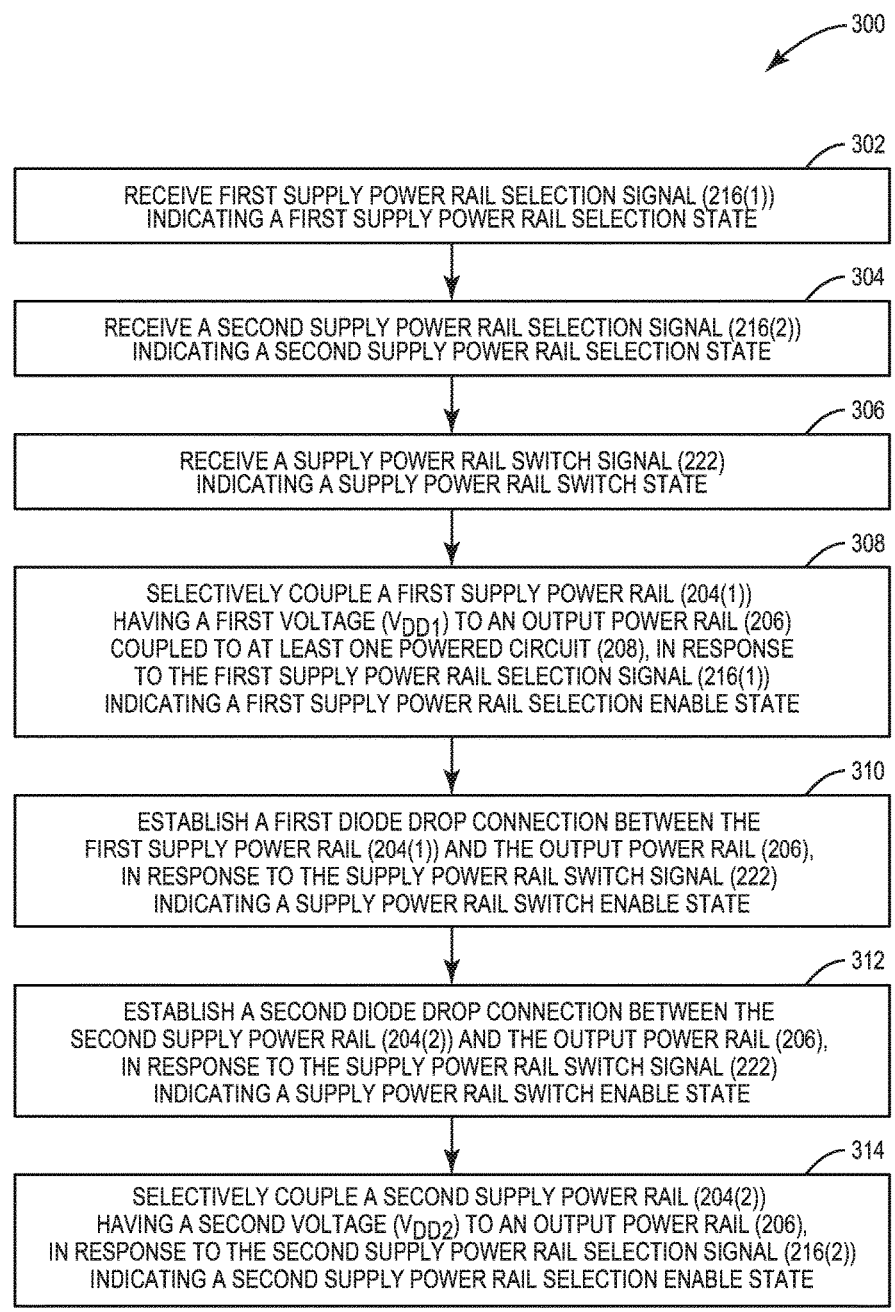
FIG. 3 is a flowchart illustrating an exemplary process of the power multiplexing circuit in FIG. 2 activating a selected supply selection circuit to switch the coupling of a selected supply power rail to the output power rail to power the powered circuit.

FIG. 3 is a flowchart illustrating an exemplary process 300 of the power multiplexing circuit 202 in FIG. 2 activating a selected supply selection circuit 212(1), 212(2) to switch coupling of a selected first or second supply power rail 204(1), 204(2) to the output power rail 206 to power the powered circuit 208. In this regard, the process 300 includes the first supply selection circuit 212(1) in the power multiplexing circuit 202 receiving the first supply power rail selection signal 216(1) indicating the first supply power rail selection state (block 302). The process 300 also includes the second supply selection circuit 212(2) in the power multiplexing circuit 202 receiving the second supply power rail selection signal 216(2) indicating the second supply power rail selection state (block 304). The process 300 also includes the first and second supply selection circuits 212(1), 212(2) in the power multiplexing circuit 202 receiving the supply power rail switch signal 222 indicating a supply power rail switch state (block 306). The process 300 also includes the first supply selection circuit 212(1) selectively coupling the first supply power rail 204(1) having the first voltage $V_{DD1}$ to an output power rail 206 coupled to the powered circuit 208, in response to the first supply power rail selection signal 216(1) indicating a first supply power rail selection enable state (block 308). The process 300 also includes establishing a first diode drop connection between the first supply power rail 204(1) and the output power rail 206, in response to the supply power rail switch signal 222 indicating a supply power rail switch enable state (block 310). The process 300 also includes establishing a second diode drop connection between the second supply power rail 204(2) and the output power rail 206, also in response to the supply power rail switch signal 222 indicating a supply power rail switch enable state (block 312). The process 300 also includes selectively coupling the second supply power rail 204(2) having the second voltage $V_{DD2}$ to the output power rail 206, in response to the second supply power rail selection signal 216(2) indicating a second supply power rail selection enable state (block 314).

Figure 4:
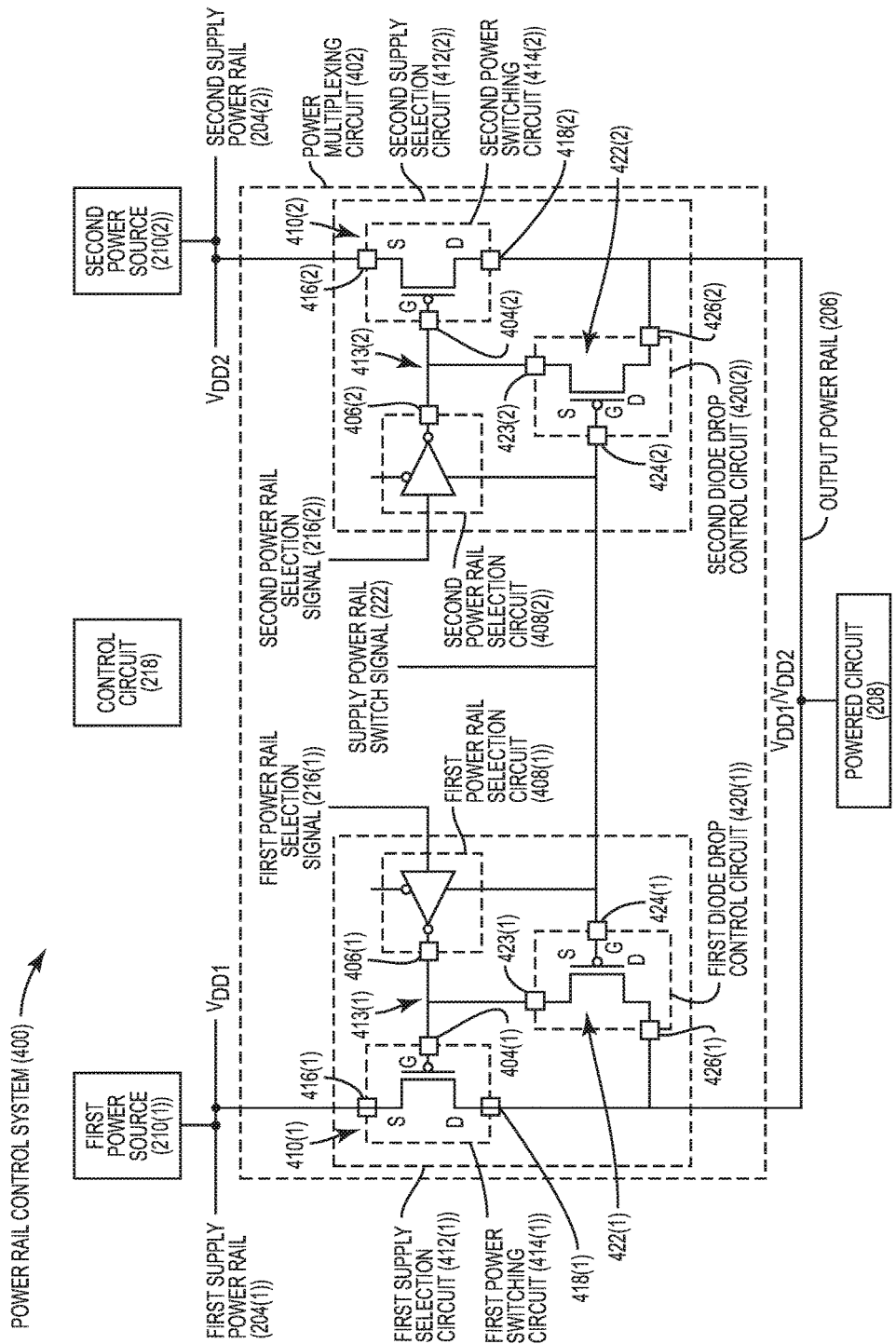
FIG. 4 is a block diagram of an exemplary power rail control system that includes an exemplary power multiplexing circuit configured to activate a selected supply selection circuit to couple an associated supply power rail to the output power rail to power the powered circuit, wherein the power multiplexing circuit additionally includes voltage control circuits configured to be activated to place the supply selection circuits in a diode drop operation mode, in response to deactivating a supply selection circuit to switch the coupling of the output power rail to a different selected supply power rail.

The diode drop connection in a power multiplexing circuit, such as the power multiplexing circuit 202 in FIG. 2, can be provided in different manners with different circuit designs. For example, FIG. 4 is a block diagram of another exemplary power rail control system 400 that includes another exemplary power multiplexing circuit 402. As will be discussed in more detail below, the power multiplexing circuit 402 is also configured to select one of the first supply power rail 204(1) and the second supply power rail 204(2) to be coupled to the output power rail 206 to provide power to the powered circuit 208 coupled to the output power rail 206. The power multiplexing circuit 402 is configured to couple either the first voltage $V_{DD1}$ on the first supply power rail 204(1) or the second voltage $V_{DD2}$ on the second supply power rail 204(2) to the output power rail 206 to provide either the first voltage $V_{DD1}$ or the second voltage $V_{DD2}$ to the powered circuit 208 for operation. Note that although the exemplary power multiplexing circuit 402 in FIG. 4 only shows two (2) supply power rails—the first supply power rail 204(1) and the second supply power rail 204(2), the power multiplexing circuit 402 could include additional supply power rails.

With continuing reference to FIG. 4, to selectively couple the first and second supply power rails 204(1), 204(2) to the output power rail 206 to supply either the first voltage $V_{DD1}$ or the second voltage $V_{DD2}$ to the powered circuit 208, the power multiplexing circuit 402 includes a first supply selection circuit 412(1) and a second supply selection circuit 412(2). The first supply selection circuit 412(1) is coupled between the first supply power rail 204(1) and the output power rail 206. The second supply selection circuit 412(2) is coupled between the second supply power rail 204(2) and the output power rail 206. The power multiplexing circuit 402 is configured to activate a selected first or second supply selection circuit 412(1), 412(2) to couple the respective first or second supply power rail 204(1), 204(2) to the output power rail 206 to power the powered circuit 208 at the first or second voltage $V_{DD1}$, $V_{DD2}$.

To select either the first or second supply power rail 204(1), 204(2) to be coupled to the output power rail 206, the first and second supply selection circuits 412(1), 412(2) include respective first and second power switching circuits 414(1), 414(2). The first power switching circuit 414(1) includes a first power rail selection input 404(1) coupled to a first power rail selection output 406(1) of a first power rail selection circuit 408(1). In this example, the first power switching circuit 414(1) is a first head switch PMOS transistor 410(1) with its gate G coupled to the first power rail selection input 404(1). The first power switching circuit 414(1) also includes a first power input 416(1) that is coupled to the first supply power rail 204(1). In this example, the first power input 416(1) is coupled to the source S of the first head switch PMOS transistor 410(1). The first power switching circuit 414(1) also includes a first power output 418(1) that is coupled to the output power rail 206. In this example, the first power output 418(1) is coupled to the drain D of the first head switch PMOS transistor 410(1). In this manner, the first head switch PMOS transistor 410(1) is configured to couple the first supply power rail 204(1) to the output power rail 206 in response to a logic "low" signal generated on the first power rail selection input 404(1) coupled to the gate G. The first head switch PMOS transistor 410(1) is also configured to decouple the first supply power rail 204(1) from the output power rail 206 in response to a logic "high" signal generated on the first power rail selection input 404(1) coupled to the gate G.

The second power switching circuit 414(2) includes a second power rail selection input 404(2) coupled to a second power rail selection output 406(2) of a second power rail selection circuit 408(2). In this example, the second power switching circuit 414(2) is a second head switch PMOS transistor 410(2) with its gate G coupled to the second power rail selection input 404(1). The second power switching circuit 414(2) also includes a second power input 416(2) that is coupled to the second supply power rail 204(2). In this example, the second power input 416(2) is coupled to the source S of the second head switch PMOS transistor 410(2). The second power switching circuit 414(2) also includes a second power output 418(2) that is coupled to the output power rail 206. In this example, the second power output 418(2) is coupled to the drain D of the second head switch PMOS transistor 410(2). In this manner, the second head switch PMOS transistor 410(2) is configured to couple the second supply power rail 204(2) to the output power rail 206 in response to a logic "low" signal generated on the second power rail selection input 404(2) coupled to the gate G. The second head switch PMOS transistor 410(2) is also configured to decouple the second supply power rail 204(2) from the output power rail 206 in response to a logic "high" signal generated on the second power rail selection input 404(2) coupled to the gate G.

In this example, the first and second power rail selection circuits 408(1), 408(2) are inverter circuits. The first and second power rail selection circuits 408(1), 408(2) are configured to receive the first and second supply power rail selection signals 216(1), 216(2) indicating first and second supply power rail selection enable states. The first and second power rail selection circuits 408(1), 408(2) are configured to generate first and second drive signals 413(1), 413(2), respectively, indicating the first and second supply power rail selection states. The first and second drive signals 413(1), 413(2) are generated on the respective first and second power rail selection outputs 406(1), 406(2) to be received by the first and second power rail selection inputs 404(1), 404(2) of the first and second power switching circuits 414(1), 414(2), respectively. The first drive signal 413(1) drives the gate G of the first head switch PMOS transistor 410(1). The second drive signal 413(2) drives the gate G of the second head switch PMOS transistor 410(2). Thus, the first supply power rail selection signal 216(1) is generated as an active "high" logic signal to indicate a first power rail selection enable state to cause the first power switching circuit 414(1) to couple the first supply power rail 204(1) to the output power rail 206. Similarly, the second supply power rail selection signal 216(2) is generated as an active "high" logic signal to indicate a second power rail selection enable state to cause the second power switching circuit 414(2) to couple the second supply power rail 204(2) to the output power rail 206.

Also, the first supply power rail selection signal 216(1) is generated as an active "low" logic signal to indicate a first power rail selection disable state to cause the first power switching circuit 414(1) to decouple the first supply power rail 204(1) from the output power rail 206. The second supply power rail selection signal 216(1) is also generated as an active "low" logic signal to indicate a second power rail selection disable state to cause the second power switching circuit 414(2) to decouple the second supply power rail 204(2) from the output power rail 206. For example, the control circuit 218 could be configured to generate the first supply power rail selection signal 216(1) to indicate either a first supply power rail selection enable state or a first supply power rail selection disable state based on determining whether the first supply power rail 204(1) should be coupled to the output power rail 206.

For the supply power rail 204(1), 204(2) that is not selected by the control circuit 218 to be coupled to the output power rail 206, the supply selection circuit 412(1), 412(2) associated with such other supply power rail 204(1), 204(2) decouples the other supply power rail 204(1), 204(2) from the output power rail 206 in response to the first or second supply power rail selection signal 216(1), 216(2) indicating respective first or second supply power rail selection disable state. Thus, the first and second supply selection circuits 412(1), 412(2) are controlled such that only one of the first and second supply power rails 204(1), 204(2) is coupled to the output power rail 206 at a time. This avoids creating a current cross-conduction path between the first and second supply power rails 204(1), 204(2). To avoid a current cross-conduction path between the first and second supply power rails 204(1), 204(2), both supply selection circuits 412(1), 412(2) could be controlled to decouple both the first and second supply power rails 204(1), 204(2) from the output power rail 206 before any next supply selection circuit 212(1), 212(2) is activated to couple its associated first or second supply power rail 204(1), 204(2) to the output power rail 206. However, this may not allow the powered circuit 208 to receive power at times during the switching of the coupling between the first and second supply power rails 204(1), 204(2) to the output power rail 206. The powered circuit 208 may require a minimum voltage for operation or retention of data, such as if the powered circuit 208 were a memory circuit.

In this regard, to maintain a voltage at the output power rail 206 to power the powered circuit 208 during switching of the coupling of the output power rail 206 between the first and second supply power rails 204(1), 204(2), but while also avoiding creating a current cross-conduction path between the first and second supply power rails 204(1), 204(2), the first and second supply selection circuits 412(1), 412(2) in the power multiplexing circuit 402 include respective first and second diode drop control circuits 420(1), 420(2). The first diode drop control circuit 420(1) is provided in the form of a first PMOS transistor 422(1) in this example. The first diode drop control circuit 420(1) includes a first diode drop input 423(1) coupled to the first power rail selection input 404(1) of the first power switching circuit 414(1). The first diode drop control circuit 420(1) also includes a first diode drop control input 424(1) coupled to the gate G of the first PMOS transistor 422(1) configured to receive the supply power rail switch signal 222. The first diode drop control circuit 420(1) also includes a first diode drop output 426(1) coupled to the drain D of the first PMOS transistor 422(1) and coupled to the first power output 418(1) of the first power switching circuit 414(1). The first diode drop control circuit 420(1) is configured to establish a first diode drop connection in a diode drop operation mode between the first power rail selection input 404(1) and the first power output 418(1), in response to the supply power rail switch signal 222 indicating the supply power rail switch enable state. Also in response to the supply power rail switch signal 222 indicating the supply power rail switch enable state, the first power rail selection circuit 408(1) is deactivated to present a high impedance to the first power rail selection input 404(1). Thus, in the diode drop operation mode, the gate G and the drain D of the first head switch PMOS transistor 410(1) is coupled together to put the first head switch PMOS transistor 410(1) in a diode drop configuration.

Thus, in the diode drop operation mode if the first voltage $V_{DD1}$ on the first supply power rail 204(1) is higher than the second voltage $V_{DD2}$ on the second supply power rail 204(2), the first head switch PMOS transistor 410(1) will be in a forward bias configuration. In this case, the first head switch PMOS transistor 410(1) will be configured to allow current to flow from the first supply power rail 204(1) to the output power rail 206 to maintain a voltage on the output power rail 206. In this example, the first head switch PMOS transistor 410(1) is configured to regulate the voltage on the output power rail 206 to a threshold voltage of the first head switch PMOS transistor 410(1) less than the first voltage $V_{DD1}$. As the voltage on the output power rail 206 discharges to the threshold voltage of the first diode drop control circuit 420(1) less than the first voltage $V_{DD1,}$ the first head switch PMOS transistor 410(1) will allow current to flow to maintain the voltage (e.g., 0.8 V) to a threshold voltage (e.g., 0.2 V) of the first head switch PMOS transistor 410(1) less than the first voltage $V_{DD1}$ (e.g., 1 V).

However, if the first voltage $V_{DD1}$ on the first supply power rail 204(1) is lower than the second voltage $V_{DD2}$ on the second supply power rail 204(2), the first head switch PMOS transistor 410(1) will be in a reverse bias configuration to prevent current flow from the output power rail 206 to the first supply power rail 204(1). Thus, the first head switch PMOS transistor 410(1) will prevent a current cross-conduction path from being created from the second supply power rail 204(2) to the first supply power rail 204(1) during the switching of the coupling of the first or second supply power rail 204(1), 204(2) to the output power rail 206.

The first diode drop control circuit 420(1) is also configured to disconnect the diode drop connection in response to the supply power rail switch signal 222 when a first or second supply power rail 204(1), 204(2) is switched to be coupled to the output power rail 206. In this instance, the first power rail selection circuit 408(1) is also activated to drive the first supply selection circuit 412(1) based on the first power rail selection state indicated by the first supply power rail selection signal 216(1).

The second diode drop control circuit 420(2) is provided in the form of a second PMOS transistor 422(2) in this example. The second diode drop control circuit 420(2) includes a second diode drop input 423(2) coupled to the second power rail selection input 404(2) of the second power switching circuit 414(2). The second diode drop control circuit 420(2) also includes a second diode drop control input 424(2) coupled to the gate G of the second PMOS transistor 422(2) configured to receive the supply power rail switch signal 222. The second diode drop control circuit 420(2) also includes a second diode drop output 426(2) coupled to the drain D of the second PMOS transistor 422(2) and coupled to the second power output 418(2) of the second power switching circuit 414(2). The second diode drop control circuit 420(2) is configured to establish a second diode drop connection in a diode drop operation mode between the second power rail selection input 404(2) and the second power output 418(2), in response to the supply power rail switch signal 222 indicating the supply power rail switch enable state. Also in response to the supply power rail switch signal 222 indicating the supply power rail switch enable state, the second power rail selection circuit 408(2) is deactivated to present a high impedance to the second power rail selection input 404(2). Thus, in the diode drop operation mode, the gate G and the drain D of the second head switch PMOS transistor 410(2) is coupled together to put the second head switch PMOS transistor 410(2) in a diode drop configuration.

Thus, in the diode drop operation mode, if the second voltage $V_{DD2}$ on the second supply power rail 204(2) is higher than the first voltage $V_{DD1}$ on the first supply power rail 204(2), the second head switch PMOS transistor 410(2) will be in a forward bias configuration. In this case, the second head switch PMOS transistor 410(2) will be configured to allow current to flow from the second supply power rail 204(2) to the output power rail 206 to maintain a voltage on the output power rail 206. In this example, the second head switch PMOS transistor 410(2) is configured to regulate the voltage on the output power rail 206 to a threshold voltage of the second head switch PMOS transistor 410(2) less than the second voltage $V_{DD2}$. As the voltage on the output power rail 206 discharges to the threshold voltage of the second diode drop control circuit 420(2) less than the second voltage $V_{DD2}$, the second head switch PMOS transistor 410(2) will allow current to flow to maintain the voltage (e.g., 0.8 V) to a threshold voltage (e.g., 0.2 V) of the second head switch PMOS transistor 410(2) less than the second voltage $V_{DD1}$ (e.g., 1 V).

However, if the second voltage $V_{DD2}$ on the second supply power rail 204(2) is lower than the first voltage $V_{DD1}$ on the first supply power rail 204(1), the second head switch PMOS transistor 410(2) will be in a reverse bias configuration to prevent current flow from the output power rail 206 to the second supply power rail 204(2). Thus, the second head switch PMOS transistor 410(2) will prevent a current cross-conduction path from being created from the first supply power rail 204(1) to the second supply power rail 204(2) during the switching of the coupling of the first or second supply power rail 204(1), 204(2) to the output power rail 206.

The second diode drop control circuit 420(2) is also configured to disconnect the diode drop connection in response to the supply power rail switch signal 222 when a first or second supply power rail 204(1), 204(2) is switched to be coupled to the output power rail 206. In this instance, the second power rail selection circuit 408(2) is also activated to drive the second supply selection circuit 412(2) based on the second supply power rail selection state indicated by the second supply power rail selection signal 216(2).

Thus, in summary, in the power multiplexing circuit 402 in FIG. 4, a voltage is continuously provided to the powered circuit 208 during the diode drop operation mode even when switching the coupling of the first or second supply power rail 204(1), 204(2) to the output power rail 206, but without creating a current cross-conduction path between the first supply power rail 204(1) to the second supply power rail 204(2). To reduce power consumption during diode drop operation mode, the powered circuit 208 may be configured to be in a retention or reduced power consumption state where only leakage currents are drawn from the output power rail 206 in a non-limiting example.

Note that although the example of the diode drop operation mode above is in reference to the first voltage $V_{DD1}$ on the first supply power rail 204(1) being higher than the second voltage $V_{DD2}$ on the second supply power rail 204(2), the diode drop operation mode is the same in reverse if the second voltage $V_{DD2}$ is higher than the first voltage $V_{DD2}$.

After the switching of the coupling of first or second supply power rail 204(1), 204(2) to the output power rail 206, the diode drop operation mode can be discontinued. In this regard, the supply power rail switch signal 222 is controlled to indicate a supply power rail switch disable state. In response, the first diode drop control circuit 420(1) disconnects the diode drop connection between the first supply power rail 204(1) and the output power rail 206. Also in response, the second diode drop control circuit 420(2) disconnects the diode drop connection between the second supply power rail 204(2) and the output power rail 206 in a diode drop operation mode. A current cross-conduction path is not created when the diode drop operation mode is discontinued, because only either the first supply power rail selection signal 216(1) or the second supply power rail selection signal 216(2) is controlled to be in a supply power rail selection enable state to select only the first power switching circuit 414(1) or the second power switching circuit 414(2) to couple either the first or second supply power rail 204(1), 204(2) to the output power rail 206 at any given time outside of diode drop operation mode.

Figure 5A:
FIG. 5A is a table illustrating an exemplary sequence of the power multiplexing circuit in FIG. 4 switching the coupling of the output power rail from a first supply power rail to a second supply power rail.

To further illustrate the operation of the power multiplexing circuit 402 in FIG. 4, tables 500 and 502 in FIGS. 5A and 5B are provided. FIG. 5A is a table 500 illustrating an exemplary sequence of the power multiplexing circuit 402 in FIG. 4 switching the coupling of the output power rail 206 from the first supply power rail 204(1) to the second supply power rail 204(2). FIG. 5B is a table 502 illustrating an exemplary sequence of the power multiplexing circuit 402 in FIG. 4 switching the coupling of the output power rail 206 from the second supply power rail 204(2) back to the first supply power rail 204(1). FIGS. 5A and 5B will be discussed in conjunction with the power multiplexing circuit 402 in FIG. 4.

With reference to entry 504(1) in FIG. 5A, when the first supply power rail 204(1) is coupled to the output power rail 206, the first supply power rail selection signal 216(1) is a logic "high" signal to indicate a first supply power rail selection enable state to cause the first supply selection circuit 412(1) to couple the first supply power rail 204(1) to the output power rail 206. The second supply power rail selection signal 216(2) is a logic "low" signal to indicate a second supply power rail selection disable state to cause the second supply selection circuit 412(2) to decouple the second supply power rail 204(2) to the output power rail 206. The supply power rail switch signal 222 is a logic "low" signal to indicate a supply power rail switch disable state so that the first and second diode drop control circuits 420(1), 420(2) do not establish a diode drop connection. Thus, the output power rail 206 is supplied with the first voltage $V_{DD1}$ from the first supply power rail 204(1).

In entry 504(2) in Figure 5A, to begin the process of switching the coupling of the output power rail 206 from the first supply power rail 204(1) to the second supply power rail 204(2), the supply power rail switch signal 222 is controlled to be a logic "high" signal to indicate a supply power rail switch enable state. In response, the first and second diode drop control circuits 420(1), 420(2) establish their diode drop connections. The voltage on the output power rail 206 will be the higher of the first voltage $V_{DD1}$ and the second voltage $V_{DD2}$ in a diode drop operation mode as previously discussed with reference to FIG. 4. In entry 504(3) in Figure 5A, the second supply power rail selection signal 216(2) is controlled to be a logic "high" signal to indicate a second supply power rail selection enable state. In response, the second supply selection circuit 412(2) couples the second supply power rail 204(2) to the output power rail 206. The first supply power rail selection signal 216(1) is controlled to be a logic "low" signal to indicate a first supply power rail selection enable state. In response, the first supply selection circuit 412(1) decouples the second supply power rail 204(2) from the output power rail 206. However, the voltage on the output power rail 206 will still be the higher of the first voltage $V_{DD1}$ and the second voltage $V_{DD2}$ in a diode drop operation mode as previously discussed with reference to FIG. 4, because the diode drop control circuits 420(1), 420(2) are still establishing their diode drop connections.

In entry 504(4) in Figure 5A, the supply power rail switch signal 222 is controlled to be in a supply power rail switch disable state. This causes the diode drop control circuits 420(1), 420(2) to disconnect their diode drop connections. Thus, the voltage on the output power rail 206 will be the second voltage $V_{DD2}$, because only the second supply power rail 204(2) is coupled to the output power rail 206.

The process of switching the coupling of the second supply power rail 204(2) to the output power rail 206, to the first supply power rail 204(1) in the power multiplexing circuit 402 in FIG. 4 is shown in entries 506(1)-506(4) in the table 502 FIG. 5B. The entries 506(1)-506(4) in table 502 in FIG. 5B show a reverse operation corresponding to entries 504(4)-504(1) in Figure 5A, respectively, and thus do not need to be re-described as being clear.

The power multiplexing circuit 402 in FIG. 4 can be provided in a processor-based system to selectively couple different supply power rails to a memory array for example.

Figure 6:
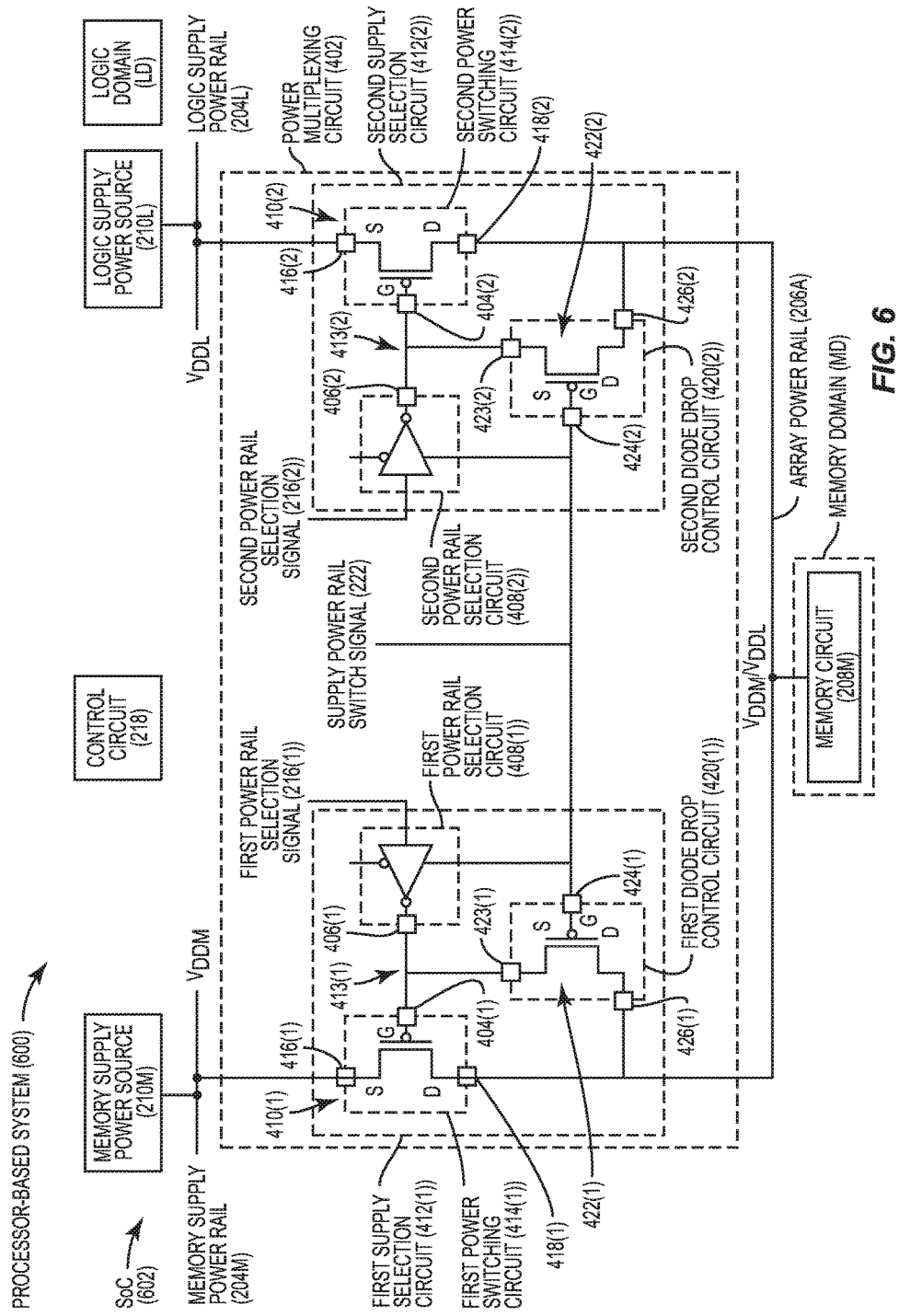
FIG. 6 is block diagram of an exemplary processor-based system that includes multiple power rails for providing power to logic and memory domains, and the power multiplexing circuit in FIG. 4 configured to select either a logic power rail or a memory power rail for providing power to a memory domain, in response to an operating voltage at the logic power rail being below, at, or above a minimum operating voltage of a memory domain.

In this regard, FIG. 6 is block diagram of an exemplary processor-based system 600 that includes a logic supply power source 210L and a memory supply power source 210M. The processor-based system 600 may be provided in a system-on-a-chip (SoC) 602 as an example. The logic supply power source 210L is configured to provide a logic voltage $V_{DDL}$ to a logic supply power rail 204L. For example, the logic supply power rail 204L may be coupled to logic blocks in a logic domain LD in the processor-based system 600. The memory supply power source 210M is configured to provide a memory voltage $V_{DDM}$ to a memory supply power rail 204M. For example, the memory supply power rail 204M may be configured to supply power to a memory circuit 208M in a memory domain MD in the processor-based system 600. For example, the minimum operating voltage for the memory circuit 208M may be a higher voltage than the minimum voltage needed for data retention only (e.g., 0.6 V). In this manner, the logic supply power source 210L can be scaled down (i.e., lowered) and/or collapsed during lower power modes of the processor-based system 600 below the minimum operating voltage needed for operation of the memory circuit 208M, because the memory circuit 208M can be separately powered through the memory supply power rail 204M coupled to the separate memory supply power source 210M.

However, it may be desired to couple the memory circuit 208M in the processor-based system 600 to the logic supply power rail 204L that is coupled to a logic domain LD to avoid or reduce the need to provide intentional decoupling capacitance in the logic domain LD. This can mitigate or avoid voltage droops from occurring on the logic supply power rail 204L at the expense of additional area and leakage power for example. In this regard, the power multiplexing circuit 402 in FIG. 4 can be employed in the processor-based system 600 as shown in FIG. 6. The operation of the power multiplexing circuit 402 is as described in FIGS. 4-5B above. The power multiplexing circuit 402 is configured to selectively couple either the memory supply power rail 204M or the logic supply power rail 204L to an array power rail 206A coupled to the memory circuit 208M.

Figure 7:
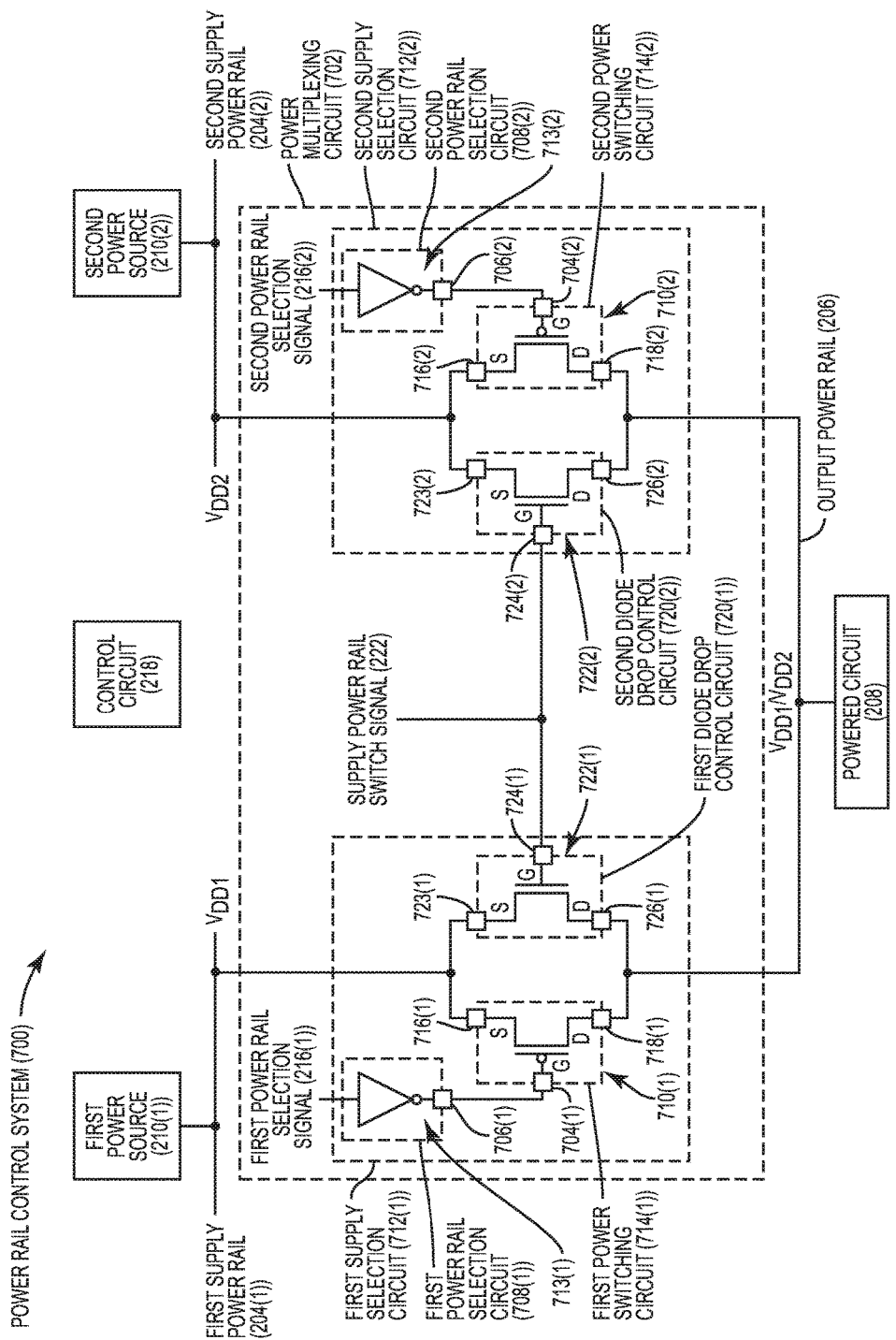
FIG. 7 is a schematic diagram of another exemplary power rail control system that includes another exemplary power multiplexing circuit configured with alternative exemplary supply selection circuits configured to couple an associated supply power rail to the output power rail to power the powered circuit.

FIG. 7 is a block diagram of another exemplary power rail control system 700 that includes another exemplary power multiplexing circuit 702. As will be discussed in more detail below, the power multiplexing circuit 702 is also configured to select one of the first supply power rail 204(1) and the second supply power rail 204(2) to be coupled to the output power rail 206 to provide power to the powered circuit 208 coupled to the output power rail 206. The power multiplexing circuit 702 is configured to couple either the first voltage $V_{DD1}$ on the first supply power rail 204(1) or the second voltage $V_{DD2}$ on the second supply power rail 204(2) to the output power rail 206 to provide either the first voltage $V_{DD1}$ or the second voltage $V_{DD2}$ to the powered circuit 208 for operation. Note that although the exemplary power multiplexing circuit 702 in FIG. 7 only shows two (2) supply power rails—the first supply power rail 204(1) and the second supply power rail 204(2), the power multiplexing circuit 702 could include additional supply power rails.

With continuing reference to FIG. 7, to selectively couple the first and second supply power rails 204(1), 204(2) to the output power rail 206 to supply either the first voltage $V_{DD1}$ or the second voltage $V_{DD2}$ to the powered circuit 208, the power multiplexing circuit 702 includes a first supply selection circuit 712(1) and a second supply selection circuit 712(2). The first supply selection circuit 712(1) is coupled between the first supply power rail 204(1) and the output power rail 206. The second supply selection circuit 712(2) is coupled between the second supply power rail 204(2) and the output power rail 206. The power multiplexing circuit 702 is configured to activate a selected first or second supply selection circuit 712(1), 712(2) to couple the respective first or second supply power rail 204(1), 204(2) to the output power rail 206 to power the powered circuit 208 at the first or second voltage $V_{DD1}$, $V_{DD2}$.

To select either the first or second supply power rail 204(1), 204(2) to be coupled to the output power rail 206, the first and second supply selection circuits 712(1), 712(2) include respective first and second power switching circuits 714(1), 714(2). The first power switching circuit 714(1) includes a first power rail selection input 704(1) coupled to a first power rail selection output 706(1) of a first power rail selection circuit 708(1). In this example, the first power switching circuit 714(1) is a first head switch PMOS transistor 710(1) with its gate G coupled to the first power rail selection input 704(1). The first power switching circuit 714(1) also includes a first power input 716(1) that is coupled to the first supply power rail 204(1). In this example, the first power input 716(1) is coupled to the source S of the first head switch PMOS transistor 710(1). The first power switching circuit 714(1) also includes a first power output 718(1) that is coupled to the output power rail 206. In this example, the first power output 718(1) is coupled to the drain D of the first head switch PMOS transistor 710(1). In this manner, the first head switch PMOS transistor 710(1) is configured to couple the first supply power rail 204(1) to the output power rail 206 in response to a logic "low" signal generated on the first power rail selection input 704(1) coupled to the gate G. The first head switch PMOS transistor 710(1) is also configured to decouple the first supply power rail 204(1) from the output power rail 206 in response to a logic "high" signal generated on the first power rail selection input 704(1) coupled to the gate G.

The second power switching circuit 714(2) includes a second power rail selection input 704(2) coupled to a second power rail selection output 706(2) of a second power rail selection circuit 708(2). In this example, the second power switching circuit 714(2) is a second head switch PMOS transistor 710(2) with its gate G coupled to the second power rail selection input 704(1). The second power switching circuit 714(2) also includes a second power input 716(2) that is coupled to the second supply power rail 204(2). In this example, the second power input 716(2) is coupled to the source S of the second head switch PMOS transistor 710(2). The second power switching circuit 714(2) also includes a second power output 718(2) that is coupled to the output power rail 206. In this example, the second power output 718(2) is coupled to the drain D of the second head switch PMOS transistor 710(2). In this manner, the second head switch PMOS transistor 710(2) is configured to couple the second supply power rail 204(2) to the output power rail 206 in response to a logic "low" signal generated on the second power rail selection input 704(2) coupled to the gate G. The second head switch PMOS transistor 710(2) is also configured to decouple the second supply power rail 204(2) from the output power rail 206 in response to a logic "high" signal generated on the second power rail selection input 704(2) coupled to the gate G.

In this example, the first and second power rail selection circuits 708(1), 708(2) are inverter circuits. The first and second power rail selection circuits 708(1), 708(2) are configured to receive the first and second supply power rail selection signals 216(1), 216(2) indicating first and second supply power rail selection enable states. The first and second power rail selection circuits 708(1), 708(2) are configured to generate first and second drive signals 713(1), 713(2), respectively, indicating the first and second supply power rail selection states. The first and second drive signals 713(1), 713(2) are generated on the respective first and second power rail selection outputs 706(1), 706(2) to be received by the first and second power rail selection inputs 704(1), 704(2) of the first and second power switching circuits 714(1), 714(2), respectively. The first drive signal 713(1) drives the gate G of the first head switch PMOS transistor 710(1). The second drive signal 713(2) drives the gate G of the second head switch PMOS transistor 710(2). Thus, the first supply power rail selection signal 216(1) is generated as an active "high" logic signal to indicate a first supply power rail selection enable state to cause the first power switching circuit 714(1) to couple the first supply power rail 204(1) to the output power rail 206. Similarly, the second supply power rail selection signal 216(2) is generated as an active "high" logic signal to indicate a second supply power rail selection enable state to cause the second power switching circuit 714(2) to couple the second supply power rail 204(2) to the output power rail 206.

Also, the first supply power rail selection signal 216(1) is generated as an active "low" logic signal to indicate a first supply power rail selection disable state to cause the first power switching circuit 714(1) to decouple the first supply power rail 204(1) from the output power rail 206. The second supply power rail selection signal 216(2) is also generated as an active "low" logic signal to indicate a second power rail selection disable state to cause the second power switching circuit 714(2) to decouple the second supply power rail 204(2) from the output power rail 206. For example, the control circuit 218 could be configured to generate the first supply power rail selection signal 216(1) to indicate either a first supply power rail selection enable state or a first supply power rail selection disable state based on determining whether the first supply power rail 204(1) should be coupled to the output power rail 206.

For the supply power rail 204(1), 204(2) that is not selected by the control circuit 218 to be coupled to the output power rail 206, the supply selection circuit 712(1), 712(2) associated with such other supply power rail 204(1), 204(2) decouples the other supply power rail 204(1), 204(2) from the output power rail 206 in response to the first or second supply power rail selection signal 216(1), 216(2) indicating respective first or second supply power rail selection disable states. Thus, the first and second supply selection circuits 712(1), 712(2) are controlled such that only one of the first and second supply power rails 204(1), 204(2) is coupled to the output power rail 206 at a time. This avoids creating a current cross-conduction path between the first and second supply power rails 204(1), 204(2). To avoid a current cross-conduction path between the first and second supply power rails 204(1), 204(2), both supply selection circuits 712(1), 712(2) could be controlled to decouple both the first and second supply power rails 204(1), 204(2) from the output power rail 206 before any next supply selection circuit 712(1), 712(2) is activated to couple its associated first or second supply power rail 204(1), 204(2) to the output power rail 206. However, this may not allow the powered circuit 208 to receive power at times during the switching of the coupling between the first and second supply power rails 204(1), 204(2) to the output power rail 206. The powered circuit 208 may require a minimum voltage for operation or retention of data, such as if the powered circuit 208 were a memory circuit.

In this regard, to maintain a voltage at the output power rail 206 to power the powered circuit 208 during switching of the coupling of the output power rail 206 between the first and second supply power rails 204(1), 204(2), but while also avoiding creating a current cross-conduction path between the first and second supply power rails 204(1), 204(2), the first and second supply selection circuits 712(1), 712(2) in the power multiplexing circuit 702 include respective first and second diode drop control circuits 720(1), 720(2). The first diode drop control circuit 720(1) is provided in the form of a first NMOS transistor 722(1) in this example. The first diode drop control circuit 720(1) includes a first diode drop input 723(1) coupled to the first supply power rail 204(1). The first diode drop control circuit 720(1) also includes a first diode drop control input 724(1) coupled to the gate G of the first NMOS transistor 722(1) configured to receive the supply power rail switch signal 222. The first diode drop control circuit 720(1) also includes a first diode drop output 726(1) coupled to the drain D of the first NMOS transistor 722(1) and coupled to the first power output 718(1) of the first power switching circuit 714(1). In this configuration, the first NMOS transistor 722(1) of the first diode drop control circuit 720(1) is configured to establish a first diode drop connection in a diode drop operation mode between the first supply power rail 204(1) and the first power output 718(1), in response to the supply power rail switch signal 222 indicating the supply power rail switch enable state.

Thus, in the diode drop operation mode if the first voltage $V_{DD1}$ on the first supply power rail 204(1) is higher than the second voltage $V_{DD2}$ on the second supply power rail 204(2), the first NMOS transistor 722(1) will be in a forward bias configuration. In this case, the first NMOS transistor 722(1) will be configured to allow current to flow from the first supply power rail 204(1) to the output power rail 206 to maintain a voltage on the output power rail 206. In this example, the first NMOS transistor 722(1) is configured to regulate the voltage on the output power rail 206 to a threshold voltage of the first NMOS transistor 722(1) less than the first voltage $V_{DD1}$. As the voltage on the output power rail 206 discharges to the threshold voltage of the first diode drop control circuit 720(1) less than the first voltage $V_{DD1}$, the first NMOS transistor 722(1) will allow current to flow to maintain the voltage (e.g., 0.8 V) to a threshold voltage (e.g., 0.2 V) of the first NMOS transistor 722(1) less than the first voltage $V_{DD1}$ (e.g., 1 V).

However, if the first voltage $V_{DD1}$ on the first supply power rail 204(1) is lower than the second voltage $V_{DD2}$ on the second supply power rail 204(2), the first NMOS transistor 722(1) will be in a reverse bias configuration to prevent current flow from the output power rail 206 to the first supply power rail 204(1). Thus, the first NMOS transistor 722(1) will prevent a current cross-conduction path from being created from the second supply power rail 204(2) to the first supply power rail 204(1) during the switching of the coupling of the first or second supply power rail 204(1), 204(2) to the output power rail 206.

The first diode drop control circuit 720(1) is also configured to disconnect the diode drop connection in response to the supply power rail switch signal 222 when a first or second supply power rail 204(1), 204(2) is switched to be coupled to the output power rail 206. In this instance, the first power rail selection circuit 708(1) is also activated to drive the first supply selection circuit 712(1) based on the first supply power rail selection state indicated by the first supply power rail selection signal 216(1).

The second diode drop control circuit 720(2) is provided in the form of a second NMOS transistor 722(2) in this example. The second diode drop control circuit 720(2) includes a second diode drop input 723(2) coupled to the second supply power rail 204(2). The second diode drop control circuit 720(2) also includes a second diode drop control input 724(2) coupled to the gate G of the second NMOS transistor 722(2) configured to receive the supply power rail switch signal 222. The second diode drop control circuit 720(2) also includes a second diode drop output 726(2) coupled to the drain D of the second NMOS transistor 722(2) and coupled to the second power output 718(2) of the second power switching circuit 714(2). The second diode drop control circuit 720(2) is configured to establish a second diode drop connection in a diode drop operation mode between the second supply power rail 204(2) and the second power output 718(2), in response to the supply power rail switch signal 222 indicating the supply power rail switch enable state.

Thus, in the diode drop operation mode, if the second voltage $V_{DD2}$ on the second supply power rail 204(2) is higher than the first voltage $V_{DD1}$ on the first supply power rail 204(2), the second NMOS transistor 722(2) will be in a forward bias configuration. In this case, the second NMOS transistor 722(2) will be configured to allow current to flow from the second supply power rail 204(2) to the output power rail 206 to maintain a voltage on the output power rail 206. In this example, the second NMOS transistor 722(2) is configured to regulate the voltage on the output power rail 206 to a threshold voltage of the second NMOS transistor 722(2) less than the second voltage $V_{DD2}$. As the voltage on the output power rail 206 discharges to the threshold voltage of the diode drop control circuit 720(2) less than the second voltage $V_{DD2}$, the second NMOS transistor 722(2) will allow current to flow to maintain the voltage (e.g., 0.8 V) to a threshold voltage (e.g., 0.2 V) of the second NMOS transistor 722(2) less than the second voltage $V_{DD1}$ (e.g., 1 V).

However, if the second voltage $V_{DD2}$ on the second supply power rail 204(2) is lower than the first voltage $V_{DD1}$ on the first supply power rail 204(1), the second NMOS transistor 722(2) will be in a reverse bias configuration to prevent current flow from the output power rail 206 to the second supply power rail 204(2). Thus, the second NMOS transistor 722(2) will prevent a current cross-conduction path from being created from the first supply power rail 204(1) to the second supply power rail 204(2) during the switching of the coupling of the first or second supply power rail 204(1), 204(2) to the output power rail 206.

The second diode drop control circuit 720(2) is also configured to disconnect the diode drop connection in response to the supply power rail switch signal 222 when a first or second supply power rail 204(1), 204(2) is switched to be coupled to the output power rail 206. In this instance, the second power rail selection circuit 708(2) is also activated to drive the second supply selection circuit 712(2) based on the second supply power rail selection state indicated by the second supply power rail selection signal 216(2).

Thus, in summary, in the power multiplexing circuit 702 in FIG. 7, a voltage is continuously provided to the powered circuit 208 during the diode drop operation mode even when switching the coupling of the first or second supply power rail 204(1), 204(2) to the output power rail 206, but without creating a current cross-conduction path between the first supply power rail 204(1) to the second supply power rail 204(2). To reduce power consumption during diode drop operation mode, the powered circuit 208 may be configured to be in a retention or reduced power consumption state where only leakage currents are drawn from the output power rail 206 in a non-limiting example.

Note that although the example of the diode drop operation mode above is in reference to the first voltage $V_{DD1}$ on the first supply power rail 204(1) being higher than the second voltage $V_{DD2}$ on the second supply power rail 204(2), the diode drop operation mode is the same in reverse if the second voltage $V_{DD2}$ is higher than the first voltage $V_{DD2}$.

After the switching of the coupling of the first or second supply power rail 204(1), 204(2) to the output power rail 206, the diode drop operation mode can be discontinued. In this regard, the supply power rail switch signal 222 is controlled to indicate a supply power rail switch disable state. In response, the first diode drop control circuit 720(2) disconnects the diode drop connection between the first supply power rail 204(1) and the output power rail 206. Also in response, the second diode drop control circuit 720(1) disconnects the diode drop connection between the second supply power rail 204(2) and the output power rail 206 in a diode drop operation mode. A current cross-conduction path is not created when the diode drop operation mode is discontinued, because only either the first supply power rail selection signal 216(1) or the second supply power rail selection signal 216(2) is controlled to be in a supply power rail selection enable state to select only the first power switching circuit 714(1) or the second power switching circuit 714(2) to couple either the first or second supply power rail 204(1), 204(2) to the output power rail 206 at any given time outside of diode drop operation mode.

Figure 8B:
FIG. 8B is a table illustrating an exemplary sequence of the power multiplexing circuit in FIG. 7 switching the coupling of the output power rail from the second supply power rail back to the first supply power rail.

To further illustrate the operation of the power multiplexing circuit 702 in FIG. 7, tables 800 and 802 in FIGS. 8A and 8B are provided. FIG. 8A is a table 800 illustrating an exemplary sequence of the power multiplexing circuit 702 in FIG. 7 switching the coupling of the output power rail 206 from the first supply power rail 204(1) to the second supply power rail 204(2). FIG. 8B is a table 802 illustrating an exemplary sequence of the power multiplexing circuit 702 in FIG. 7 switching the coupling of the output power rail 206 from the second supply power rail 204(2) back to the first supply power rail 204(1). FIGS. 8A and 8B will be discussed in conjunction with the power multiplexing circuit 702 in FIG. 7.

With reference to entry 804(1) in FIG. 8A, when the first supply power rail 204(1) is coupled to the output power rail 206, the first supply power rail selection signal 216(1) is a logic "high" signal to indicate a first supply power rail selection enable state to cause the first supply selection circuit 712(1) to couple the first supply power rail 204(1) to the output power rail 206. The second supply power rail selection signal 216(2) is a logic "low" signal to indicate a second supply power rail selection disable state to cause the second supply selection circuit 712(2) to decouple the second supply power rail 204(2) to the output power rail 206. The supply power rail switch signal 222 is a logic "low" signal to indicate a supply power rail switch disable state so that the first and second diode drop control circuits 720(1), 720(2) do not establish a diode drop connection. Thus, the output power rail 206 is supplied with the first voltage $V_{DD1}$ from the first supply power rail 204(1).

In entry 804(2) in FIG. 8A, to being the process of switching the coupling of the output power rail 206 from the first supply power rail 204(1) to the second supply power rail 204(2), the supply power rail switch signal 222 is controlled to be a logic "high" signal to indicate a supply power rail switch enable state. In response, the first and second diode drop control circuits 720(1), 720(2) establish their diode drop connections. The voltage on the output power rail 206 will be the first voltage $V_{DD1}$ in a diode drop operation mode as previously discussed with reference to FIG. 7. In entry 804(3) in FIG. 8A, the first supply power rail selection signal 216(1) is a logic "low" signal to indicate a first supply power rail selection disable state to cause the second supply selection circuit 712(2) to decouple the first supply power rail 204(1) from the output power rail 206. Thus, by the first and second diode drop control circuits 720(1), 720(2) being in diode drop operation mode to establish their diode drop connections, the higher voltage between the first voltage $V_{DD1}$ and the second voltage $V_{DD2}$ is provided to the output power rail 206.

In entry 804(4) in FIG. 8A, the second supply power rail selection signal 216(2) is next controlled to be a logic "high" signal to indicate a second supply power rail selection enable state. In response, the second supply selection circuit 712(2) couples the second supply power rail 204(2) to the output power rail 206. In entry 804(5) in FIG. 8A, the supply power rail switch signal 222 is controlled to be in a supply power rail switch disable state. This causes the diode drop control circuits 720(1), 720(2) to disconnect their diode drop connections. Thus, the voltage on the output power rail 206 will be the second voltage $V_{DD2}$, because only the second supply power rail 204(2) is coupled to the output power rail 206.

The process of switching the coupling of the second supply power rail 204(2) to the output power rail 206, to the first supply power rail 204(1) in the power multiplexing circuit 702 in FIG. 7 is shown in entries 806(1)-806(5) in the table 802 in FIG. 8B. The entries 806(1)-806(5) in the table 802 in FIG. 8B show a reverse operation corresponding to entries 804(5)-804(1), respectively, in FIG. 8A, and thus do not need to be re-described as being clear.

Figure 9:
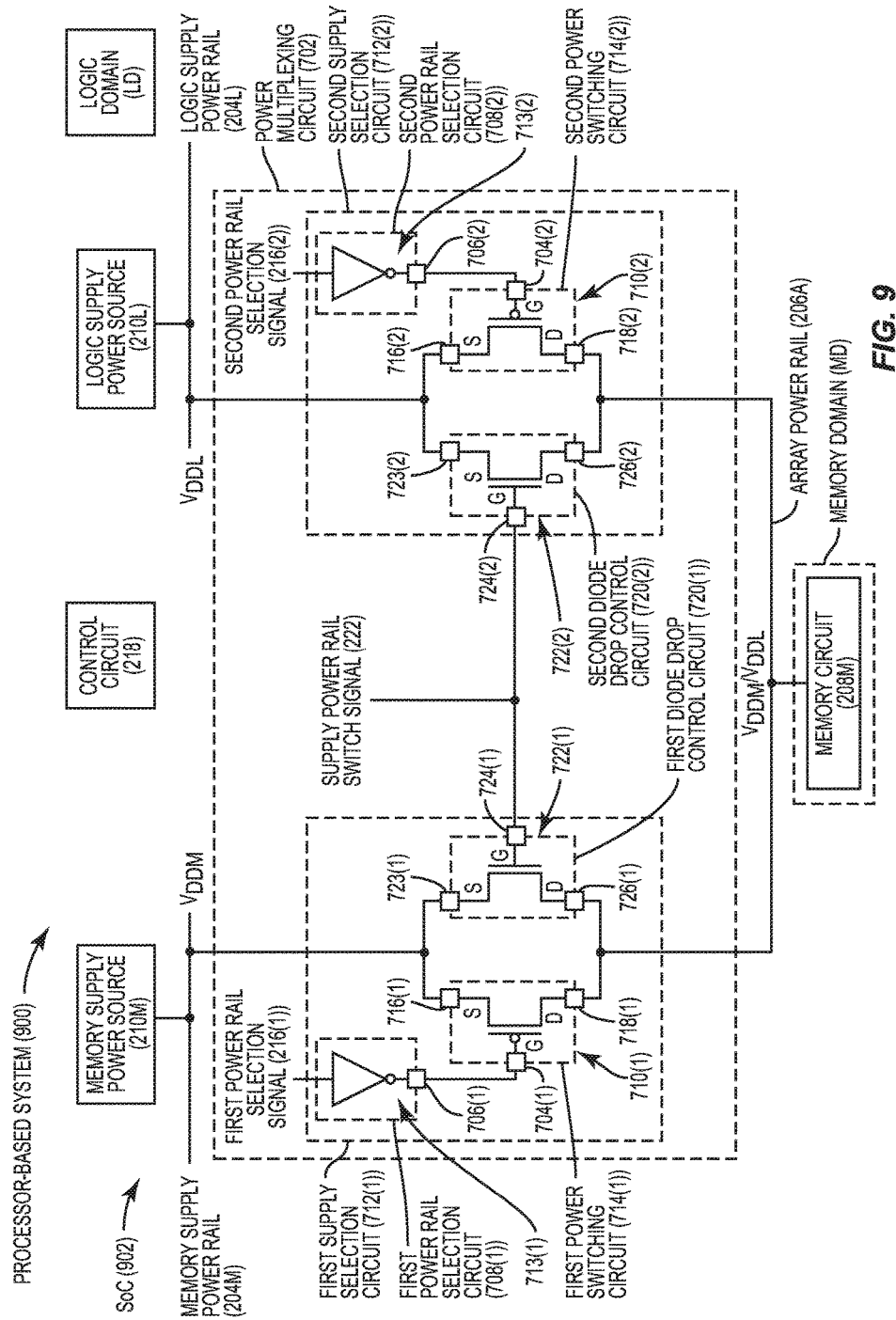
FIG. 9 is block diagram of an exemplary processor-based system that includes multiple power rails for providing power to logic and memory domains, and the power multiplexing circuit in FIG. 9 configured to select either a logic power rail or a memory power rail for providing power to a memory domain, in response to an operating voltage at the logic power rail being below, at, or above a minimum operating voltage of a memory domain.

The power multiplexing circuit 702 in FIG. 7 can be provided in a processor-based system to selectively couple different supply power rails to a memory array for example. In this regard, FIG. 9 is block diagram of an exemplary processor-based system 900 that includes the logic supply power source 210L and the memory supply power source 210M as provided in the processor-based system 600 in FIG. 6. The processor-based system 900 in FIG. 9 may be provided in a system-on-a-chip (SoC) 902 as an example. The logic supply power source 210L is configured to provide a logic voltage $V_{DDL}$ to a logic supply power rail 204L. For example, the logic supply power rail 204L may be coupled to logic blocks in a logic domain LD in the processor-based system 900. The memory supply power source 210M is configured to provide a memory voltage $V_{DDM}$ to a memory supply power rail 204M. For example, the memory supply power rail 204M may be configured to supply power to a memory circuit 208M in a memory domain MD in the processor-based system 900. For example, the minimum operating voltage for the memory circuit 208M may be a higher voltage than the minimum voltage needed for data retention only (e.g., 0.6 V). In this manner, the logic supply power source 210L can be scaled down (i.e., lowered) and/or collapsed during lower power modes of the processor-based system 900 below the minimum operating voltage needed for operation of the memory circuit 208M, because the memory circuit 208M can be separately powered through the memory supply power rail 204M coupled to the separate memory supply power source 210M.

However, it may be desired to couple the memory circuit 208M in the processor-based system 900 to the logic supply power rail 204L that is coupled to a logic domain LD to avoid or reduce the need to provide intentional decoupling capacitance in the logic domain LD. This can mitigate or avoid voltage droops from occurring on the logic supply power rail 204L at the expense of additional area and leakage power for example. In this regard, the power multiplexing circuit 702 in FIG. 7 can be employed in the processor-based system 900 as shown in FIG. 9. The operation of the power multiplexing circuit 702 is as described in FIGS. 7-8B above. The power multiplexing circuit 702 is configured to selectively couple either the memory supply power rail 204M or the logic supply power rail 204L to an array power rail 206A coupled to the memory circuit 208M.

Power rail control systems that include power multiplexing circuits that include cross-current protection, and in accordance with the power multiplexing circuit aspects in this disclosure, may be provided in or integrated into in any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a server computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 10:
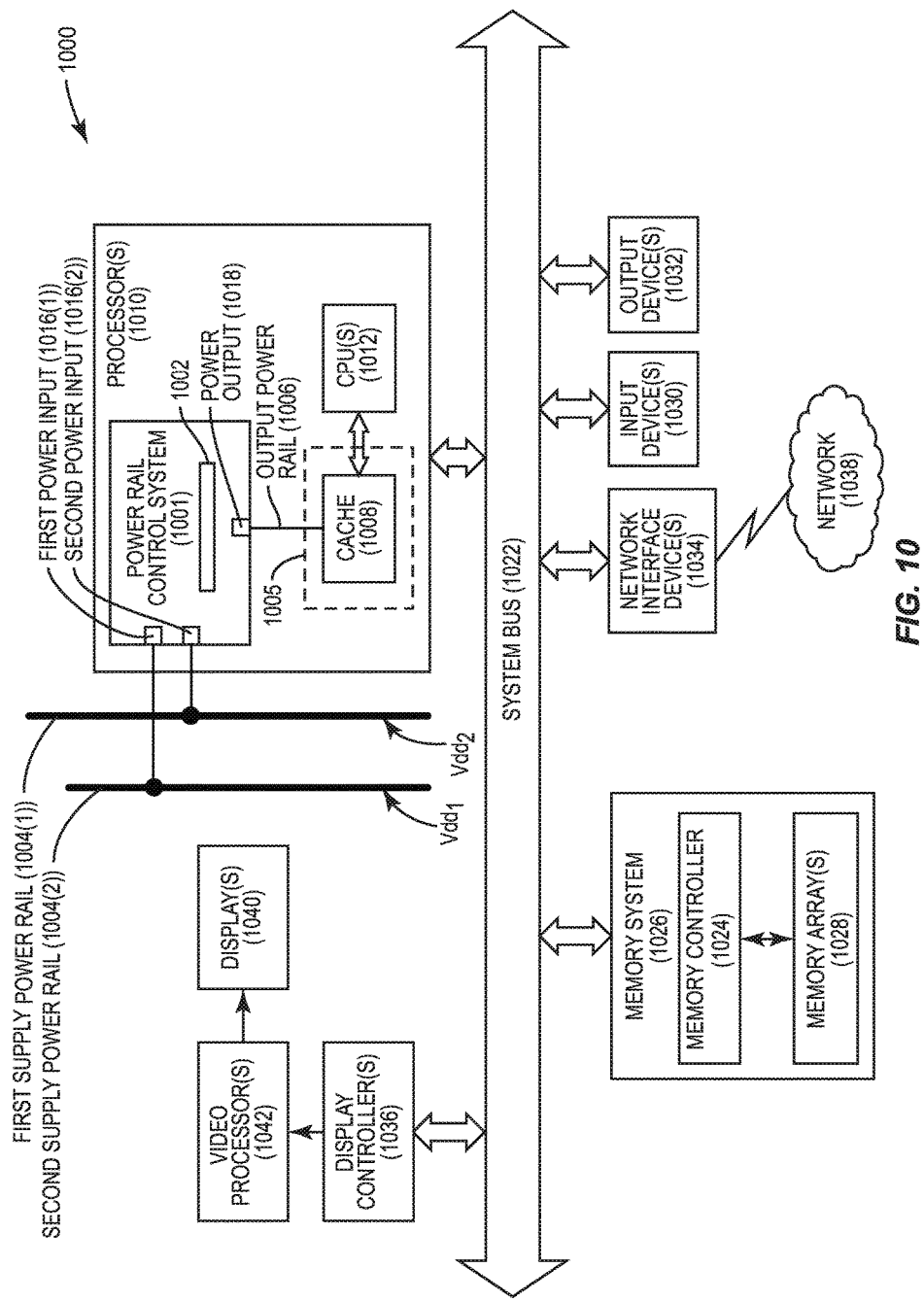
FIG. 10 is a block diagram of an exemplary processor-based system that can include the power rail control circuit in FIG. 2 selectively coupling a power rail selection circuit or a memory power rail to a memory domain, according to any of the aspects disclosed herein.

In this regard, FIG. 10 illustrates an example of a processor-based system 1000 that includes a power rail control system 1001 configured to control the selective coupling of one of first and second supply power rails 1004(1), 1004(2) to a memory domain 1005, such as to reduce intentional decoupling capacitance in a logic domain according to any of the particular aspects discussed above. The power rail control system 1001 includes a power multiplexing circuit 1002 that includes current cross-conduction protection by employing a diode drop control circuit. For example, the power multiplexing circuit 1002 may be any of the power multiplexing circuits 202, 402, 702 in FIGS. 2, 4, and 7, respectively, as examples. In this example, the memory domain 1105 includes a cache memory 1008 that is included in a processor 1010 and coupled to one or more CPUs 1012 for rapid access to temporarily stored data. The power rail control system 1001 has a first power input 1016(1) coupled to the first supply power rail 1004(1) and a second power input 1016(2) coupled to the second supply power rail 1004(2). The power rail control system 1001 has a power output 1018 coupled to an output power rail 1006 configured to provide power to the memory domain 1105. The power rail control system 1101 is configured to provide the first voltage $V_{DD1}$ on the first supply power rail 1004(1) on the output power rail 1006 when the first voltage $V_{DD1}$ is at or above the minimum operating voltage of the memory domain 1005. The power rail control system 1101 is configured to provide the second voltage $V_{DD2}$ on the second supply power rail 1004(2) on the output power rail 1006 when the voltage $V_{DD1}$ is below the minimum operating voltage of the memory domain 1005. Any of the features and examples described above with regard to the power multiplexing circuits 202, 402, 702 can be provided in the power multiplexing circuit 1102 in the power rail control system 1001.

In this example, the processor-based system 1000 also includes one or more processors 1010, each including one or more CPUs 1012. The processors 1010 include the cache memory 1008 coupled to the CPUs 1012 for rapid access to temporarily stored data. The processors 1010 are coupled to a system bus 1022 and can intercouple master and slave devices included in the processor-based system 1100. As is well known, the processors 1010 communicate with these other devices by exchanging address, control, and data information over the system bus 1022. For example, the processors 1010 can communicate bus transaction requests to a memory controller 1024 in a memory system 1026 as an example of a slave device. Although not illustrated in FIG. 10, multiple system buses 1022 could be provided, wherein each system bus 1022 constitutes a different fabric. In this example, the memory controller 1024 is configured to provide memory access requests to one or more memory arrays 1028 in the memory system 1026.

Other devices can be connected to the system bus 1022. As illustrated in FIG. 10, these devices can include one or more input devices 1030, one or more output devices 1032, one or more network interface devices 1034, and one or more display controllers 1036, as examples. The input devices 1030 can include any type of input device, including but not limited to input keys, switches, voice processors, etc. The output devices 1032 can include any type of output device, including but not limited to audio, video, other visual indicators, etc. The network interface devices 1034 can be any devices configured to allow exchange of data to and from a network 1038. The network 1038 can be any type of network, including but not limited to a wired or wireless network, a private or public network, a local area network (LAN), a wireless local area network (WLAN), a wide area network (WAN), a BLUETOOTH™ network, and the Internet. The network interface devices 1034 can be configured to support any type of communications protocol desired.

The processors 1010 may also be configured to access the display controllers 1036 over the system bus 1022 to control information sent to one or more displays 1040. The display controllers 1030 sends information to the displays 1040 to be displayed via one or more video processors 1042, which process the information to be displayed into a format suitable for the displays 1040. The displays 1040 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A power multiplexing circuit, comprising:
   a first supply selection circuit, comprising:
      a first power switching circuit configured to receive a first supply power rail selection signal, the first power switching circuit configured to:
         selectively couple a first supply power rail having a first voltage to an output power rail coupled to at least one powered circuit, in response to the first supply power rail selection signal indicating a first supply power rail selection enable state; and
      a first diode drop control circuit configured to receive a supply power rail switch signal, and establish a first diode drop connection between the first supply power rail and the output power rail, in response to the supply power rail switch signal indicating a supply power rail switch enable state; and
   a second supply selection circuit, comprising:
      a second power switching circuit comprising a second supply power rail selection input configured to receive a second supply power rail selection signal, the second power switching circuit configured to:
         selectively couple a second supply power rail having a second voltage to the output power rail, in response to the second supply power rail selection signal indicating a second supply power rail selection enable state; and
      a second diode drop control circuit configured to receive the supply power rail switch signal and establish a second diode drop connection between the second supply power rail and the output power rail, in response to the supply power rail switch signal indicating a supply power rail switch enable state.

2. The power multiplexing circuit of claim 1, wherein:
   the first power switching circuit is further configured to selectively decouple the first supply power rail from the output power rail in response to the first supply power rail selection signal indicating a first supply power rail selection disable state; and
   the second power switching circuit is further configured to selectively decouple the second supply power rail from the output power rail in response to the second supply power rail selection signal indicating a second supply power rail selection disable state.

3. The power multiplexing circuit of claim 1, wherein:
   the first diode drop control circuit is further configured to disconnect the first diode drop connection between the first supply power rail and the output power rail, in response to the supply power rail switch signal indicating a supply power rail switch disable state; and
   the second diode drop control circuit is further configured to disconnect the second diode drop connection between the second supply power rail and the output power rail, in response to the supply power rail switch signal indicating a supply power rail switch disable state.

4. The power multiplexing circuit of claim 1, wherein:
   in response to the first voltage being higher than the second voltage, the first diode drop control circuit further is configured to maintain a voltage of a threshold voltage below the first voltage on the output power rail, in response to the supply power rail switch signal indicating the supply power rail switch enable state.

5. The power multiplexing circuit of claim 1, wherein:
   in response to the first voltage being lower than the second voltage, the first diode drop control circuit is further configured to prevent or reduce current flow from the output power rail to the first supply power rail, in response to the supply power rail switch signal indicating the supply power rail switch enable state.

6. The power multiplexing circuit of claim 1, wherein:
   the first power switching circuit comprises:
      a first power input coupled to the first supply power rail;
      a first power output coupled to the output power rail;
      a first power rail selection input configured to receive the first supply power rail selection signal;

the first power switching circuit configured to:
    selectively couple the first power input to the first power output to provide the first voltage to the at least one powered circuit in response to the first supply power rail selection signal indicating the first supply power rail selection enable state; and
the second power switching circuit comprises:
    a second power input coupled to the second supply power rail;
    a second power output coupled to the output power rail;
    a second power rail selection input configured to receive the second supply power rail selection signal;
    the second power switching circuit configured to:
        selectively couple the second power input to the second power output to provide the second voltage to the at least one powered circuit in response to the second supply power rail selection signal indicating the second supply power rail selection enable state.

7. The power multiplexing circuit of claim 6, wherein:
the first power switching circuit is further configured to selectively decouple the first power input from the first power output in response to the first supply power rail selection signal indicating a first supply power rail selection disable state; and
the second power switching circuit is further configured to selectively decouple the second power input from the second power output in response to the second supply power rail selection signal indicating a second supply power rail selection disable state.

8. The power multiplexing circuit of claim 6, wherein:
the first power switching circuit comprises a first transistor comprising a first gate coupled to the first power rail selection input, a first source coupled to the first power input, and a first drain coupled to the first power output; and
the second power switching circuit comprises a second transistor comprising a second gate coupled to the second power rail selection input, a second source coupled to the second power input, and a second drain coupled to the second power output.

9. The power multiplexing circuit of claim 6, wherein:
the first diode drop control circuit comprises:
    a first diode drop input coupled to the first power rail selection input of the first power switching circuit;
    a first diode drop control input configured to receive the supply power rail switch signal; and
    a first diode drop output coupled to the first power output;
    the first diode drop control circuit configured to establish the first diode drop connection between the first power rail selection input and the first power output, in response to the supply power rail switch signal indicating the supply power rail switch enable state; and
the second diode drop control circuit comprises:
    a second diode drop input coupled to the second power rail selection input of the second power switching circuit;
    a second diode drop control input configured to receive the supply power rail switch signal; and
    a second diode drop output coupled to the second power output;
    the second diode drop control circuit configured to establish the second diode drop connection between the second power rail selection input and the second power output, in response to the supply power rail switch signal indicating the supply power rail switch enable state.

10. The power multiplexing circuit of claim 9, wherein:
the first diode drop control circuit is further configured to disconnect the first diode drop connection between the first power rail selection input and the first power output, in response to the supply power rail switch signal indicating a supply power rail switch disable state; and
the second diode drop control circuit is further configured to disconnect the second diode drop connection between the second power rail selection input and the second power output, in response to the supply power rail switch signal indicating a supply power rail switch disable state.

11. The power multiplexing circuit of claim 9, wherein:
the first diode drop control circuit comprises a first transistor comprising a first gate configured to receive the supply power rail switch signal, a first source coupled to the first gate of the first transistor of the first power switching circuit, and a first drain coupled to the first power output; and
the second diode drop control circuit comprises a second transistor comprising a second gate configured to receive the supply power rail switch signal, a second source coupled to the second gate of the second transistor of the second power switching circuit, and a second drain coupled to the second power output.

12. The power multiplexing circuit of claim 6, wherein:
the first supply selection circuit further comprises a first power rail selection circuit configured to receive the first supply power rail selection signal and generate a first drive signal based on the first supply power rail selection signal indicating the first power rail selection enable state to the first power rail selection input; and
the second supply selection circuit further comprises a second power rail selection circuit configured to receive the second supply power rail selection signal and generate a second drive signal based on the second supply power rail selection signal indicating the second power rail selection enable state to the second power rail selection input;
the first power switching circuit is configured to selectively couple the first supply power rail to the output power rail in response to the first drive signal indicating the first supply power rail selection enable state; and
the second power switching circuit is configured to selectively couple the second supply power rail to the output power rail in response to the second drive signal indicating the second supply power rail selection enable state.

13. The power multiplexing circuit of claim 12, wherein:
the first power switching circuit is configured to selectively decouple the first supply power rail from the output power rail in response to the first drive signal indicating a first supply power rail disable state; and
the second power switching circuit configured to selectively decouple the second supply power rail from the output power rail in response to the second drive signal indicating a second supply power rail disable state.

14. The power multiplexing circuit of claim 6, wherein:
the first diode drop control circuit comprises:
    a first diode drop input coupled to the first supply power rail;
    a first diode drop control input configured to receive the supply power rail switch signal; and a first diode drop output coupled to the output power rail;

the first diode drop control circuit is configured to establish the first diode drop connection between the first supply power rail and the output power rail, in response to the supply power rail switch signal indicating the supply power rail switch enable state; and the second diode drop control circuit comprises:

a second diode drop input coupled to the second supply power rail;

a second diode drop control input configured to receive the supply power rail switch signal; and a second diode drop output coupled to the output power rail;

the second diode drop control circuit is configured to establish the second diode drop connection between the second supply power rail and the output power rail, in response to the supply power rail switch signal indicating the supply power rail switch enable state.

15. The power multiplexing circuit of claim 14, wherein:

the first diode drop control circuit is further configured to disconnect the first diode drop connection between the first supply power rail and the output power rail, in response to the supply power rail switch signal indicating a supply power rail switch disable state; and the second diode drop control circuit is further configured to disconnect the second diode drop connection between the second supply power rail and the output power rail, in response to the supply power rail switch signal indicating a supply power rail switch disable state.

16. The power multiplexing circuit of claim 14, wherein:

the first diode drop control circuit comprises a first transistor comprising a first gate configured to receive the supply power rail switch signal, a first source coupled to the first supply power rail, and a first drain coupled to the output power rail; and the second diode drop control circuit comprises a second transistor comprising a second gate configured to receive the supply power rail switch signal, a second source coupled to the second supply power rail, and a second drain coupled to the output power rail.

17. The power multiplexing circuit of claim 14, wherein:

the first supply selection circuit further comprises a first power rail selection circuit configured to receive the first supply power rail selection signal and generate a first drive signal based on the first supply power rail selection signal indicating the first power rail selection enable state to a first power rail selection input; and the second supply selection circuit further comprises a second power rail selection circuit configured to receive the second supply power rail selection signal and generate a second drive signal based on the second supply power rail selection signal indicating the second power rail selection enable state to a second power rail selection input;

the first power switching circuit is configured to selectively couple the first supply power rail to the output power rail in response to the first drive signal indicating the first supply power rail selection enable state; and the second power switching circuit is configured to selectively couple the second supply power rail to the output power rail in response to the second drive signal indicating the second supply power rail selection enable state.

18. The power multiplexing circuit of claim 17, wherein:

the first power switching circuit is configured to selectively decouple the first supply power rail to the output power rail in response to the first drive signal indicating a first supply power rail disable state; and the second power switching circuit is configured to selectively couple the second supply power rail to the output power rail in response to the second drive signal indicating a second supply power rail disable state.

19. The power multiplexing circuit of claim 1, further comprising:

a third supply selection circuit, comprising:

a third power switching circuit configured to receive a third supply power rail selection signal, the third power switching circuit configured to:

selectively couple a third supply power rail having a third voltage to an output power rail coupled to the at least one powered circuit, in response to a third supply power rail selection signal indicating a third supply power rail selection enable state; and a third diode drop control circuit configured to receive the supply power rail switch signal, the third diode drop control circuit configured to establish a third diode drop connection between the third supply power rail and the output power rail, in response to the supply power rail switch signal indicating a supply power rail switch enable state.

20. The power multiplexing circuit of claim 1 integrated into a system-on-a-chip (SoC).

21. The power multiplexing circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a server computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

22. A power multiplexing circuit, comprising:

a means for receiving a first supply power rail selection signal;

a means for selectively coupling a first supply power rail having a first voltage to an output power rail coupled to at least one powered circuit, in response to the first supply power rail selection signal indicating a first supply power rail selection enable state;

a means for receiving a supply power rail switch signal;

a means for establishing a first diode drop connection between the first supply power rail and the output power rail, in response to the supply power rail switch signal indicating a supply power rail switch enable state;

a means for receiving a second supply power rail selection signal;

a means for selectively coupling a second supply power rail having a second voltage to the output power rail, in response to a second supply power rail selection signal indicating a second supply power rail selection enable state; and a means for establishing a second diode drop connection between the second supply power rail and the output power rail, in response to the supply power rail switch signal indicating a supply power rail switch enable state.

23. A method of selectively switching a coupling of a supply power rail among a plurality of supply power rails to an output power rail for powering a powered circuit, comprising:

receiving a first supply power rail selection signal indicating a first supply power rail selection state;

receiving a second supply power rail selection signal indicating a second supply power rail selection state;

receiving a supply power rail switch signal indicating a supply power rail switch state;

selectively coupling a first supply power rail having a first voltage to an output power rail coupled to at least one powered circuit, in response to the first supply power rail selection signal indicating a first supply power rail selection enable state;

establishing a first diode drop connection between the first supply power rail and the output power rail, in response to the supply power rail switch signal indicating a supply power rail switch enable state;

establishing a second diode drop connection between a second supply power rail and the output power rail, in response to the supply power rail switch signal indicating the supply power rail switch enable state; and selectively coupling the second supply power rail having a second voltage to the output power rail, in response to the second supply power rail selection signal indicating a second supply power rail selection enable state.

24. The method of claim 23, further comprising:

selectively decoupling the first supply power rail from the output power rail in response to the first supply power rail selection signal indicating a first supply power rail selection disable state; and selectively decoupling the second supply power rail from the output power rail in response to the second supply power rail selection signal indicating a second supply power rail selection disable state.

25. The method of claim 23, further comprising:

disconnecting the first diode drop connection between the first supply power rail and the output power rail, in response to the supply power rail switch signal indicating a supply power rail switch disable state; and disconnecting the second diode drop connection between the second supply power rail and the output power rail, in response to the supply power rail switch signal indicating a supply power rail switch disable state.

26. The method of claim 23, wherein, in response to the first voltage being higher than the second voltage, maintaining a voltage of a threshold voltage below the first voltage on the output power rail, in response to the supply power rail switch signal indicating the supply power rail switch enable state.

27. The method of claim 23, further comprising, in response to the first voltage being lower than the second voltage, preventing current flow from the output power rail to the first supply power rail, in response to the supply power rail switch signal indicating the supply power rail switch enable state.

28. The method of claim 23, comprising:

selectively coupling a first power input coupled to the first supply power rail to a first power output coupled to the output power rail to provide the first voltage to the at least one powered circuit in response to the first supply power rail selection signal indicating the first supply power rail selection enable state; and selectively coupling a second power input coupled to the second supply power rail to a second power output coupled to the output power rail to provide the second voltage to the at least one powered circuit in response to the second supply power rail selection signal indicating the second supply power rail selection enable state.

29. The method of claim 28, comprising:

selectively decoupling the first power input from the first power output in response to the first supply power rail selection signal indicating a first supply power rail selection disable state; and selectively decoupling the second power input from the second power output in response to the second supply power rail selection signal indicating a second supply power rail selection disable state.

30. The method of claim 28, further comprising:

disconnecting the first diode drop connection between the first supply power rail and the output power rail, in response to the supply power rail switch signal indicating a supply power rail switch disable state; and disconnecting the second diode drop connection between the second supply power rail and the output power rail, in response to the supply power rail switch signal indicating a supply power rail switch disable state.

31. The method of claim 28, further comprising:

generating a first drive signal based on the first supply power rail selection signal indicating the first supply power rail selection enable state to a first power rail selection input; and generating a second drive signal based on the second supply power rail selection signal indicating the second supply power rail selection enable state to a second power rail selection input;

selectively coupling the first supply power rail to the output power rail in response to the first drive signal indicating the first supply power rail selection enable state; and selectively coupling the second supply power rail to the output power rail in response to the second drive signal indicating the second supply power rail selection enable state.

32. The method of claim 31, further comprising:

selectively decoupling the first supply power rail from the output power rail in response to the first drive signal indicating a first supply power rail disable state; and selectively decoupling the second supply power rail from the output power rail in response to the second drive signal indicating a second supply power rail disable state.

33. The method of claim 29, comprising establishing the first diode drop connection between the first supply power rail and the output power rail, in response to the supply power rail switch signal indicating the supply power rail switch enable state before selectively coupling the second supply power rail having the second voltage to the output power rail, in response to the second supply power rail selection signal indicating the second supply power rail selection enable state.

34. The method of claim 33, comprising selectively decoupling the first supply power rail having the first voltage to the output power rail, in response to the first supply power rail selection signal indicating the first supply power rail selection enable state, after selectively coupling the second supply power rail having the second voltage to the output power rail, in response to the second supply power rail selection signal indicating the second supply power rail selection enable state.

35. The method of claim 29, comprising selectively decoupling the first supply power rail having the first voltage to the output power rail, in response to the first supply power rail selection signal indicating the first supply power rail selection enable state, after selectively coupling the second supply power rail having the second voltage to the output power rail, in response to the second supply power rail selection signal indicating the second supply power rail selection enable state.

36. The method of claim 28, comprising:
establishing the first diode drop connection between the first supply power rail and the output power rail, in response to the supply power rail switch signal indicating the supply power rail switch enable state; and
establishing the second diode drop connection between the second supply power rail and the output power rail, in response to the supply power rail switch signal indicating the supply power rail switch enable state.

37. The method of claim 36, further comprising:
disconnecting the first diode drop connection between the first supply power rail and the output power rail, in response to the supply power rail switch signal indicating a supply power rail switch disable state; and
disconnecting the second diode drop connection between the second supply power rail and the output power rail, in response to the supply power rail switch signal indicating a supply power rail switch disable state.

38. The method of claim 36, wherein:
a first supply selection circuit further comprises a first power rail selection circuit configured to receive the first supply power rail selection signal and provide a first drive signal based on the first supply power rail selection signal indicating the first power rail selection enable state; and
a second supply selection circuit further comprises a second power rail selection circuit configured to receive the second supply power rail selection signal to provide a second drive signal based on the second supply power rail selection signal indicating the second power rail selection enable state;
the first power switching circuit is configured to selectively couple the first supply power rail to the output power rail in response to the first drive signal indicating the first supply power rail selection enable state; and
the second power switching circuit is configured to selectively couple the second supply power rail to the output power rail in response to the second drive signal indicating the second supply power rail selection enable state.

39. The method of claim 38, further comprising:
selectively decoupling the first supply power rail from the output power rail in response to the first drive signal indicating a first supply power rail disable state; and
selectively decoupling the second supply power rail from the output power rail in response to the second drive signal indicating a second supply power rail disable state.

40. The method of claim 36, comprising selectively decoupling the first power input from the first power output in response to the first supply power rail selection signal indicating a first supply power rail disable state and selectively decoupling the second power input from the second power output in response to the second supply power rail selection signal indicating a second supply power rail disable state, after establishing the first diode drop connection between the first supply power rail and the output power rail, in response to the supply power rail switch signal indicating the supply power rail switch enable state and establishing the second diode drop connection between the second supply power rail and the output power rail, in response to the supply power rail switch signal indicating the supply power rail switch enable state.

41. The method of claim 40, comprising selectively coupling the second power input from the second power output in response to the second supply power rail selection signal indicating a second supply power rail enable state, after establishing the first diode drop connection between the first supply power rail and the output power rail, in response to the supply power rail switch signal indicating the supply power rail switch enable state and establishing the second diode drop connection between the second supply power rail and the output power rail, in response to the supply power rail switch signal indicating the supply power rail switch enable state.

42. The method of claim 36, comprising selectively coupling the second power input from the second power output in response to the second supply power rail selection signal indicating a second supply power rail enable state, after establishing the first diode drop connection between the first supply power rail and the output power rail, in response to the supply power rail switch signal indicating the supply power rail switch enable state and establishing the second diode drop connection between the second supply power rail and the output power rail, in response to the supply power rail switch signal indicating the supply power rail switch enable state.

43. The method of claim 36, comprising disconnecting the second diode drop connection between the second supply power rail and the output power rail, in response to the supply power rail switch signal indicating a supply power rail switch disable state after selectively coupling the second power input from the second power output in response to the second supply power rail selection signal indicating a second supply power rail enable state.

44. The method of claim 23, further comprising:
receiving a third supply power rail selection signal indicating a third supply power rail selection state;
selectively coupling a third supply power rail having a third voltage to the output power rail coupled to the at least one powered circuit, in response to the third supply power rail selection signal indicating a third supply power rail selection enable state; and
establishing a third diode drop connection between the third supply power rail and the output power rail, in response to the supply power rail switch signal indicating the supply power rail switch enable state.

45. A power rail control system for a processor-based system, comprising:
a memory supply power rail configured to receive a memory voltage from a memory power supply in a memory domain;
a logic supply power rail configured to receive a logic voltage from a logic power supply in a logic domain; and
a power multiplexing circuit, comprising:
a first supply selection circuit, comprising:
a first power switching circuit configured to receive a first supply power rail selection signal, the first power switching circuit configured to:
selectively couple the memory supply power rail to an array power rail coupled to at least one memory circuit in the memory domain to provide the memory voltage to the at least one memory circuit, in response to the first supply power rail selection signal indicating a first supply power rail selection enable state; and
a first diode drop control circuit configured to receive a supply power rail switch signal and provide a first diode drop connection between the memory supply power rail and an output power rail, in response to the supply power rail switch signal indicating a supply power rail switch enable state; and
a second supply selection circuit, comprising:
a second power switching circuit configured to receive second supply power rail selection signal, the second power switching circuit configured to:
selectively couple the logic supply power rail to the array power rail to provide the logic voltage to the at least one memory circuit in response to a second supply power rail selection signal indicating a second supply power rail selection enable state; and
a second diode drop control circuit configured to receive the supply power rail switch signal and provide a second diode drop connection between the logic supply power rail and the output power rail, in response to the supply power rail switch signal indicating the second supply power rail switch enable state.

46. The power rail control system of claim 45, wherein the power multiplexing circuit is configured to couple the logic power rail to the at least one memory circuit to couple an intrinsic decoupling capacitance of the at least one memory circuit to the logic domain.

47. The power rail control system of claim 45, wherein:
the first power switching circuit is further configured to selectively decouple the memory supply power rail to the array power rail, in response to the first supply power rail selection signal indicating a first supply power rail disable state; and
the second power switching circuit is further configured to selectively decouple the logic supply power rail to the array power rail, in response to the second supply power rail selection signal indicating a second supply power rail disable state.

48. The power rail control system of claim 45, wherein:
the first diode drop control circuit is further configured to disconnect the first diode drop connection between the memory supply power rail and the array power rail, in response to the supply power rail switch signal indicating a supply power rail switch disable state; and
the second diode drop control circuit is further configured to disconnect the second diode drop connection between the logic supply power rail and the array power rail, in response to the supply power rail switch signal indicating a supply power rail switch disable state.

49. The power rail control system of claim 45, wherein:
in response to the memory voltage being higher than the logic voltage, the first diode drop control circuit is further configured to maintain a voltage of a threshold voltage below the memory voltage on the array power rail, in response to the supply power rail switch signal indicating the supply power rail switch enable state.

50. The power rail control system of claim 45, wherein:
in response to the memory voltage being lower than the logic voltage, the first diode drop control circuit is further configured to prevent or reduce current flow from the array power rail to a first supply power rail, in response to the supply power rail switch signal indicating the supply power rail switch enable state.

51. The power rail control system of claim 45, wherein:
in response to the logic voltage being higher than the memory voltage, the second diode drop control circuit is further configured to maintain a voltage of a threshold voltage below the logic voltage on the array power rail, in response to the supply power rail switch signal indicating the supply power rail switch enable state.

52. The power rail control system of claim 45, wherein:
in response to the logic voltage being lower than the memory voltage, the second diode drop control circuit is further configured to prevent or reduce current flow from the array power rail to the memory supply power rail, in response to the supply power rail switch signal indicating the supply power rail switch enable state.

53. The power rail control system of claim 45, wherein:
the first power switching circuit comprises:
a first power input coupled to the memory supply power rail;
a first power output coupled to the array power rail; and
a first power rail selection input configured to receive the first supply power rail selection signal;
the first power switching circuit configured to:
selectively couple the first power input to the first power output to provide the memory voltage to the at least one memory circuit in response to the first supply power rail selection signal indicating the first supply power rail selection enable state; and
the second power switching circuit comprises:
a second power input coupled to the logic supply power rail;
a second power output coupled to the array power rail; and
a second power rail selection input configured to receive the second supply power rail selection signal;
the second power switching circuit configured to:
selectively couple the second power input to the second power output to provide the logic voltage to the at least one memory circuit in response to the second supply power rail selection signal indicating the second supply power rail selection enable state.

54. The power rail control system of claim 53, wherein:
the first power switching circuit is further configured to selectively decouple the first power input from the first power output in response to the first supply power rail selection signal indicating a first supply power rail disable state; and
the second power switching circuit is further configured to selectively decouple the second power input from the second power output in response to the second supply power rail selection signal indicating a second supply power rail disable state.

55. The power rail control system of claim 53, wherein:
the first diode drop control circuit comprises:
a first diode drop input coupled to the first power input of the first power switching circuit;
a first diode drop control input configured to receive the supply power rail switch signal; and
a first diode drop output coupled to the first power output;
the first diode drop control circuit configured to provide the first diode drop connection between the first power rail selection input and the first power output, in response to the supply power rail switch signal indicating the supply power rail switch enable state; and the second diode drop control circuit comprises:
- a second diode drop input coupled to the second power input of the second power switching circuit;
- a second diode drop control input configured to receive the supply power rail switch signal; and
- a second diode drop output coupled to the second power output;
- the second diode drop control circuit configured to provide the second diode drop connection between the second power rail selection input and the second power output, in response to the supply power rail switch signal indicating the supply power rail switch enable state.

56. The power rail control system of claim 55, wherein:
the first diode drop control circuit is further configured to disconnect the first diode drop connection between the first power rail selection input and the first power output, in response to the supply power rail switch signal indicating a supply power rail switch disable state; and the second diode drop control circuit is further configured to disconnect the second diode drop connection between the second power rail selection input and the second power output, in response to the supply power rail switch signal indicating a supply power rail switch disable state.

57. The power multiplexing circuit of claim 53, wherein:
the first diode drop control circuit comprises:
- a first diode drop input coupled to the memory supply power rail;
- a first diode drop control input configured to receive the supply power rail switch signal; and
- a first diode drop output coupled to the array power rail;
- the first diode drop control circuit configured to provide the first diode drop connection between the memory supply power rail and the array power rail, in response to the supply power rail switch signal indicating the supply power rail switch enable state; and the second diode drop control circuit comprises:
- a second diode drop input coupled to the logic supply power rail;
- a second diode drop control input configured to receive the supply power rail switch signal; and
- a second diode drop output coupled to the array power rail;
- the second diode drop control circuit configured to provide the second diode drop connection between the logic supply power rail and the array power rail, in response to the supply power rail switch signal indicating the supply power rail switch enable state.

58. The power rail control system of claim 57, wherein:
the first diode drop control circuit is further configured to disconnect the first diode drop connection between the memory supply power rail and the array power rail, in response to the supply power rail switch signal indicating a supply power rail switch disable state; and the second diode drop control circuit is further configured to disconnect the second diode drop connection between the logic supply power rail and the array power rail, in response to the supply power rail switch signal indicating a supply power rail switch disable state.

59. The power rail control system of claim 58, wherein:
the first diode drop control circuit comprises a first transistor comprising a first gate configured to receive the supply power rail switch signal, a first source coupled to the memory supply power rail, and a first drain coupled to the array power rail; and the second diode drop control circuit comprises a second transistor comprising a second gate configured to receive the supply power rail switch signal, a second source coupled to the memory supply power rail, and a second drain coupled to the array power rail.

* * * * *